United States Patent
Akiyama et al.

(10) Patent No.: US 10,886,890 B2
(45) Date of Patent: Jan. 5, 2021

(54) COMPOSITE SUBSTRATE FOR SURFACE ACOUSTIC WAVE DEVICE, METHOD OF PRODUCING COMPOSITE SUBSTRATE FOR SURFACE ACOUSTIC WAVE DEVICE, AND SURFACE ACOUSTIC WAVE DEVICE USING COMPOSITE SUBSTRATE

(71) Applicant: SHIN-ETSU CHEMICAL CO., LTD., Tokyo (JP)

(72) Inventors: Shoji Akiyama, Gunma (JP); Masayuki Tanno, Gunma (JP); Shozo Shirai, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 43 days.

(21) Appl. No.: 16/319,016

(22) PCT Filed: Jul. 4, 2017

(86) PCT No.: PCT/JP2017/024490
§ 371 (c)(1),
(2) Date: Jan. 18, 2019

(87) PCT Pub. No.: WO2018/016314
PCT Pub. Date: Jan. 25, 2018

(65) Prior Publication Data
US 2019/0288661 A1 Sep. 19, 2019

(30) Foreign Application Priority Data

Jul. 20, 2016 (JP) .................................. 2016-142219
Oct. 6, 2016 (JP) .................................. 2016-198110
Apr. 28, 2017 (JP) .................................. 2017-089665

(51) Int. Cl.
*H03H 9/02* (2006.01)
*H03H 3/08* (2006.01)
*H03H 9/25* (2006.01)

(52) U.S. Cl.
CPC .......... *H03H 9/02614* (2013.01); *H03H 3/08* (2013.01); *H03H 9/02559* (2013.01);
(Continued)

(58) Field of Classification Search
CPC .. H03H 9/02614; H03H 3/08; H03H 9/02559; H03H 9/02574; H03H 9/02818; H03H 9/25; H01L 41/313
(Continued)

(56) References Cited

U.S. PATENT DOCUMENTS 3,887,887 A 6/1975 Wagers et al.
5,446,330 A 8/1995 Eda et al.
(Continued)

FOREIGN PATENT DOCUMENTS

JP S50-099249 8/1975
JP H06-326553 11/1994
(Continued)

OTHER PUBLICATIONS

Machine English Translation of JP2001053579A published on Feb. 23, 2001 (Year: 2001).*
(Continued)

*Primary Examiner* — Rakesh B Patel
*Assistant Examiner* — Jorge L Salazar, Jr.
(74) *Attorney, Agent, or Firm* — Greenblum & Bernstein, P.L.C.

(57) ABSTRACT

Provided is a high-performance composite substrate for surface acoustic wave device which has good temperature characteristics and in which spurious caused by the reflection of a wave on a joined interface between a piezoelectric
(Continued)

crystal film and a support substrate is reduced. The composite substrate for surface acoustic wave device includes: a piezoelectric single crystal substrate; and a support substrate, where, at a portion of a joined interface between the piezoelectric single crystal substrate and the support substrate, at least one of the piezoelectric single crystal substrate and the support substrate has an uneven structure, a ratio of an average length RSm of elements in a cross-sectional curve of the uneven structure to a wavelength $\lambda$ of a surface acoustic wave when the substrate is used as a surface acoustic wave device is equal to or more than 0.2 and equal to or less than 7.0.

23 Claims, 24 Drawing Sheets

(52) U.S. Cl.
CPC .... *H03H 9/02574* (2013.01); *H03H 9/02818* (2013.01); *H03H 9/25* (2013.01)

(58) Field of Classification Search
USPC .......................................... 333/133, 193–196
See application file for complete search history.

(56) References Cited

U.S. PATENT DOCUMENTS

| 8,866,365 | B2 | 10/2014 | Hori et al. |
| 2017/0054068 | A1 | 2/2017 | Masayuki et al. |

FOREIGN PATENT DOCUMENTS

| JP | 2001-053579 | 2/2001 |
| JP | 2015-228637 | 12/2015 |
| WO | 2014/027538 | 2/2014 |

OTHER PUBLICATIONS

"Temperature Compensation Technology for SAW-Duplexer Used in RF Front End of Smartphone", Dempa Shimbun High Technology, Nov. 8, 2012 (with partial English translation).
Kobayashi et al., "A Study on Temperature-Compensated Hybrid Substrates for Surface Acoustic Wave Filters", IEEE International Ultrasonic Symposium Proceedings, Oct. 11-14, 2010, pp. 637-640.
International Search Report issued with respect to PCT/JP2017/024490, dated Sep. 26, 2017.
International Preliminary Report on Patentability issued with respect to Patent Application No. PCT/JP2017/024490 dated Jan. 22, 2019.

* cited by examiner

RSm/λ = 0.6 (λ = 5μm), Ra = 0.28μm (A)

(B)

(C)

US 10,886,890 B2

COMPOSITE SUBSTRATE FOR SURFACE ACOUSTIC WAVE DEVICE, METHOD OF PRODUCING COMPOSITE SUBSTRATE FOR SURFACE ACOUSTIC WAVE DEVICE, AND SURFACE ACOUSTIC WAVE DEVICE USING COMPOSITE SUBSTRATE

TECHNICAL FIELD

The present invention relates to a composite substrate for surface acoustic wave device in which a piezoelectric single crystal substrate is bonded to a support substrate, a method of producing the composite substrate for surface acoustic wave device, and a surface acoustic wave device using the composite substrate.

BACKGROUND ART

In recent years, in the market of mobile communications typified by smartphones, data traffic has been rapidly increased. To cope with this, it is necessary to increase the number of communication bands, and it is indispensable to miniaturize various parts such as surface acoustic wave devices and to achieve high performance of the parts.

Piezoelectric materials such as lithium tantalate (LT) and lithium niobate (LN) are widely used as materials for surface acoustic wave (SAW) devices. Although the materials have a large electromechanical coupling coefficient and the bandwidth of the devices can be broadened, there is a problem that the temperature stability of the materials is low, and so the adaptable frequency is shifted by the temperature change. This is because lithium tantalate or lithium niobate has a very high thermal expansion coefficient.

In order to solve the problem, there has been proposed a composite substrate obtained by bonding a material having a small thermal expansion coefficient to lithium tantalate or lithium niobate and thinning the side of the piezoelectric material to a thickness of several µm to several tens µm. This composite substrate is a composite substrate in which the thermal expansion of the piezoelectric material is suppressed by bonding the material having a small thermal expansion coefficient such as sapphire or silicon and thus the temperature characteristics are improved (Non Patent Document 1). FIG. 21 shows the thermal expansion coefficients of various materials for reference.

PRIOR ART REFERENCES

Non Patent Documents

Non Patent Document 1: Temperature Compensation Technology for SAW-Duplexer Used in RF Front End of Smartphone, Dempa Shimbun High Technology, Nov. 8, 2012

Non Patent Document 2: A study on Temperature-Compensated Hybrid Substrates for Surface Acoustic Wave Filters", 2010 IEEE International Ultrasonic Symposium Proceedings, page 637-640.

SUMMARY OF THE INVENTION

Problems to be Solved by the Invention

However, in the case of the above-described composite substrate, there is a problem that a noise called spurious or ripple occurs at a frequency higher than the pass band. The noise is caused by the reflection of a wave at a joined interface between a piezoelectric crystal film and a support substrate.

FIGS. 22 and 23 are graphs each showing S11 (reflection characteristics) and S12 (insertion loss) of a four-stage ladder filter produced using a composite substrate made of a Si substrate and a 20 µm-thick LT substrate. In FIG. 23, a portion in which the insertion loss value is small at a frequency higher than the pass band is observed. In FIG. 22, spurious in S11 occurs at the frequency. Here, the difference between peaks and valleys of the spar bus is defined as amplitude.

Several methods have been proposed to solve the problem. Non Patent Document 2 discloses a method in which a bonding surface of an LT substrate is roughened with a No. 1000 grinding stone so as to have an arithmetic average roughness Ra of 300 nm, and the roughened surface is joined with a support substrate using an adhesive, whereby the spurious intensity is reduced.

However, as a result of studying the method described in Non Patent Document 2, the present inventors have found that even when LT substrates having the same degree of arithmetic average roughness Ra are used to from composite substrates, the spurious intensities differ between the composite substrates. FIG. 24 shows the results obtained by bonding LT substrates having the same degree of arithmetic average roughness Ra to silicon substrates and measuring the spurious intensities. According to the results, the spurious intensities largely differ between the LT substrates having the same degree of arithmetic average roughness Ra, and thus an element different from the arithmetic average roughness Ra has an important influence on reduction of spurious intensity.

Therefore, as a result of further study, the present inventors have found that a ratio of the pitch of an uneven structure at a portion of a joined interface between a piezoelectric crystal substrate and a support substrate to a wavelength of the surface acoustic wave is an important element to reduce the spurious of the composite substrate, and have completed the present invention.

In this case, the pitch of the uneven structure is evaluated by an average length RSm of elements in a cross-sectional curve of the uneven structure.

Accordingly, an object of the present invention is to provide a high-performance composite substrate for surface acoustic wave device which has good temperature characteristics and in which spurious caused by the reflection of a wave on a joined interface between a piezoelectric crystal film and a support substrate is reduced, a method of producing the composite substrate for surface acoustic wave device, and a surface acoustic wave device using the composite substrate.

Means for Solving the Problems

That is, the composite substrate for surface acoustic wave device of the present invention is a composite substrate for surface acoustic wave device including: a piezoelectric single crystal substrate; and a support substrate, where, at a portion of a joined interface between the piezoelectric single crystal substrate and the support substrate, at least one of the piezoelectric single crystal substrate and the support substrate has an uneven structure, a ratio of an average length RSm of elements in a cross-sectional curve of the uneven structure to a wavelength $\lambda$ of a surface acoustic wave when the substrate is used as a surface acoustic wave device is equal to or more than 0.2 and equal to or less than 7.0.

An arithmetic average roughness Ra in the cross-sectional curve of the uneven structure of the present invention is preferably equal to or more than 100 nm. At a portion of a joined interface between a piezoelectric single crystal substrate and a support substrate, an intervening layer is present between the piezoelectric single crystal substrate and the support substrate. The composite substrate preferably contains at least one of $SiO_2$, $SiO_{2\pm0.5}$, a-Si, p-Si, a-SiC, and $Al_2O_3$ as the intervening layer.

The composite substrate of the present invention preferably contains at least thermally oxidized silica or silica heat-treated at a temperature of 800° C. or higher as the intervening layer.

The thickness of the intervening layer is preferably equal to or less than 1.2 times the wavelength λ of the surface acoustic wave when the substrate is used as a surface acoustic wave device. In addition, the thickness of the piezoelectric single crystal substrate is preferably equal to or more than 1.0 times and equal to or less than 3.5 times the wavelength λ of the surface acoustic wave when the substrate is used as a surface acoustic wave device.

The support substrate of the present invention is preferably any one of silicon, glass, quartz, alumina, sapphire, silicon carbide and silicon nitride. In the case where the silicon substrate has an uneven structure as a support substrate, the uneven structure is preferably a pyramid-shaped structure.

The piezoelectric single crystal substrate of the present invention is preferably a lithium tantalate single crystal substrate or a lithium niobate single crystal substrate. The piezoelectric single crystal substrate of the present invention is preferably a rotated Y-cut lithium tantalate single crystal substrate whose crystal orientation is rotated from 36° Y through 49° Y cut or a lithium tantalate single crystal substrate doped with Fe at a concentration of from 25 ppm to 150 ppm.

Further, the piezoelectric single crystal substrate of the present invention has a roughly uniform Li concentration in a thickness direction of the piezoelectric single crystal substrate. In that case, it is preferable that a ratio of Li to Ta or Nb is Li:Ta=50−α:50+α or Li:Nb=50−α:50+α, and α is in a range of −1.0<α<2.5.

Further, the piezoelectric single crystal substrate of the present invention may have a Li concentration which varies in the thickness direction of the piezoelectric single crystal substrate. In that case, it is preferable that the Li concentration at the side of the joined interface between the piezoelectric single crystal substrate and the support substrate is higher than the Li concentration at a surface at an opposite side of the interface side, or a ratio of Li to Ta or Nb at the side of the portion of the joined interface between the piezoelectric single crystal substrate and the support substrate is Li:Ta=50−α:50+α or Li:Nb=50−α:50+α, and α is in a range of −1.0<α<2.5.

Subsequently, the method of producing a composite substrate for surface acoustic wave device of the present invention includes at least the steps of: forming an uneven structure on a surface of a piezoelectric single crystal substrate and/or a support substrate; and forming an intervening layer on the uneven structure, where the method includes any one of the steps of: joining an intervening layer formed on a piezoelectric single crystal substrate with a support substrate; joining an intervening layer formed on a support substrate with a piezoelectric single crystal substrate; and joining an intervening layer formed on a piezoelectric single crystal substrate with an intervening layer formed on a support substrate. In this case, the method preferably includes a step of mirror-polishing a surface of the intervening layer.

Further, the method of producing a composite substrate for surface acoustic wave device of the present invention includes at least the steps of: forming an uneven structure on a surface of a support substrate by wet etching; and joining the support substrate with a piezoelectric single crystal substrate so that the uneven structure-formed surface of the support substrate is a joined interface. In this case, it is preferable that, in the step of forming the uneven structure, a pyramid-shaped uneven structure is formed on a surface of a support substrate made of silicon single crystal by wet etching.

Further, in the production method of the present invention, it is preferable that the piezoelectric single crystal substrate has a Li concentration which varies in the thickness direction of the piezoelectric single crystal substrate, the Li concentration at an arbitrary depth from at least one surface of the substrate is roughly uniform, the piezoelectric single crystal substrate is joined with a support substrate, and a surface layer of the piezoelectric single crystal substrate at an opposite side of the joined surface is removed so as to leave at least a part of a portion in which the Li concentration is roughly uniform or to leave only the portion in which the Li concentration is roughly uniform. In this case, it is preferable that the portion in which the Li concentration is roughly uniform is a pseudo stoichiometric composition.

Advantageous Effects of Invention

The present invention can provide a high-performance composite substrate for surface acoustic wave device which has good temperature characteristics and in which spurious caused by the reflection of a wave on a joined interface between a piezoelectric crystal film and a support substrate is reduced, a method of producing the composite substrate, and a surface acoustic wave device using the composite substrate.

DESCRIPTION OF EMBODIMENTS

Figure 1:
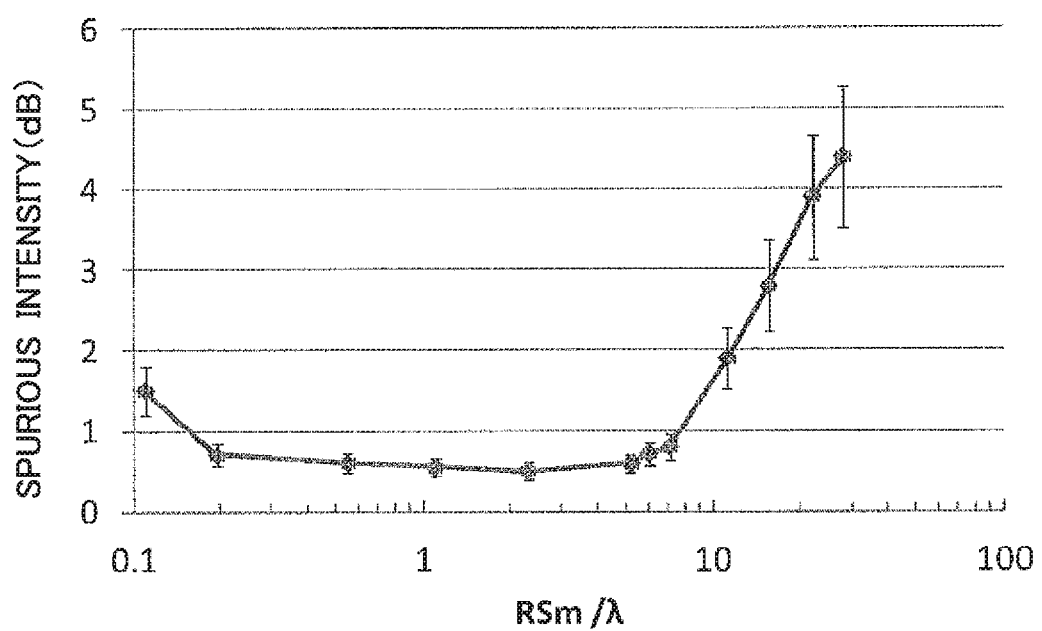
FIG. 1 is a graph showing a relationship between spurious intensity and RSm/λ in Example 1.

Hereinafter, embodiments of the present invention will be described in detail, but the present invention is not limited thereto. The present invention relates to a composite substrate for surface acoustic wave device including the piezoelectric single crystal substrate 1 and the support substrate 2, a method of producing the composite substrate for surface acoustic wave device, and a surface acoustic wave device using the composite substrate. The composite substrate of the present invention preferably has a mode in which the piezoelectric single crystal substrate 1 is bonded to the support substrate 2, and the bonding method is not limited.

As the method of bonding (joining) the piezoelectric single crystal substrate 1 to the support substrate 2, a known method can be used. For example, the substrates can be joined with each other using a room temperature bonding method or an adhesive. When bonding is performed at room temperature, the surface activation treatment can be performed by, for example, an ozone water treatment, a UV ozone treatment, an ion beam treatment or a plasma treatment.

Here, the piezoelectric single crystal substrate 1 and the support substrate 2 may be directly joined with each other. Since at least one of the piezoelectric single crystal substrate 1 and the support substrate 2 has an uneven structure, it is actually preferable to form an intervening layer 3 between the substrates.

The intervening layer 3 can be formed using the adhesive 5 such as an acrylic adhesive, an epoxy adhesive or a silicone adhesive, or norganic material 6 such as $SiO_2$, a-Si, p-Si, a-SiC or $Al_2O_3$. However, in an actual device, it is difficult to use an adhesive containing an organic component from the viewpoint of reliability. Further, the inorganic material used as the intervening layer need not be strictly stoichiometric like $SiO_2±0.5$.

Figure 16:
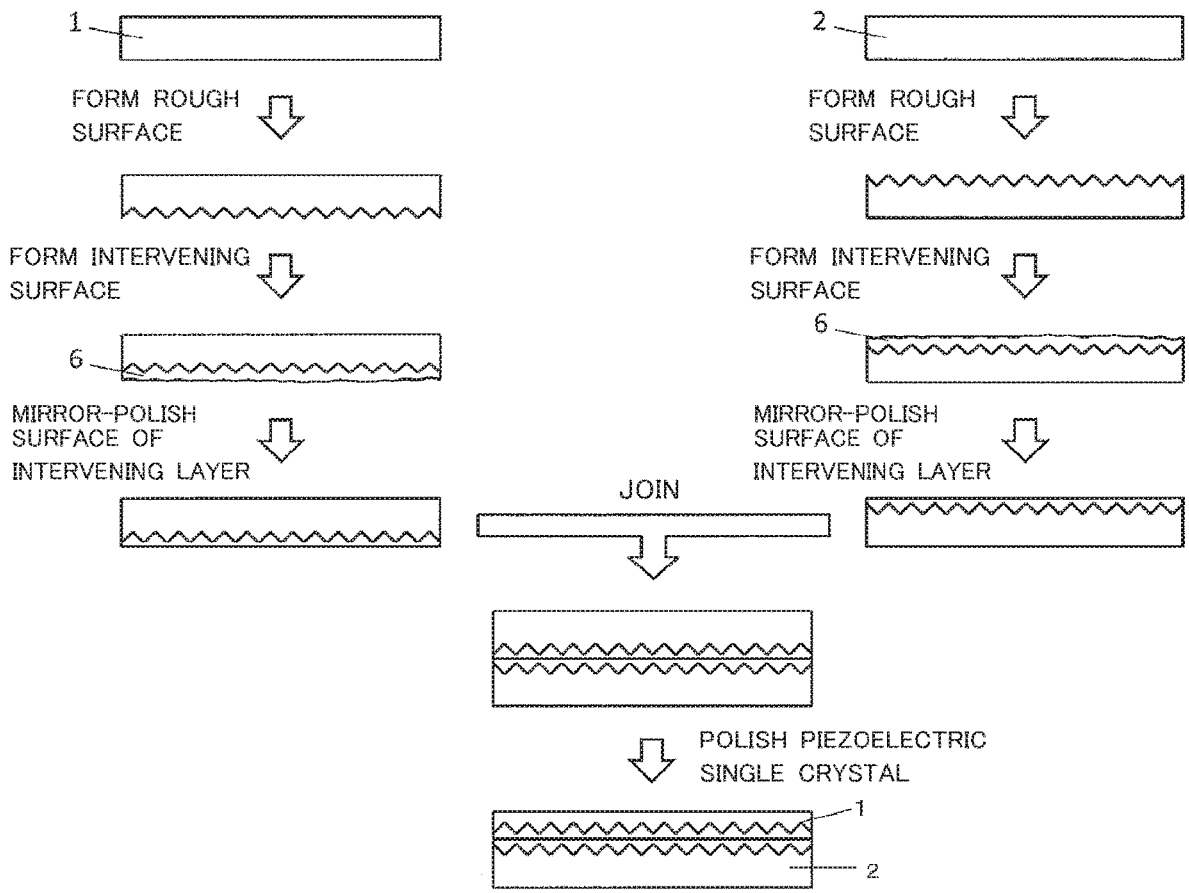
FIG. 16 is a view showing an aspect in which the surface of a piezoelectric single crystal substrate 1 and the surface of a support substrate 2 are roughened (to form an uneven structure), inorganic materials 6 are formed as intervening layers on the roughened surfaces, and the surfaces of the intervening layers are mirror-polished to produce a composite substrate.
Figure 17:
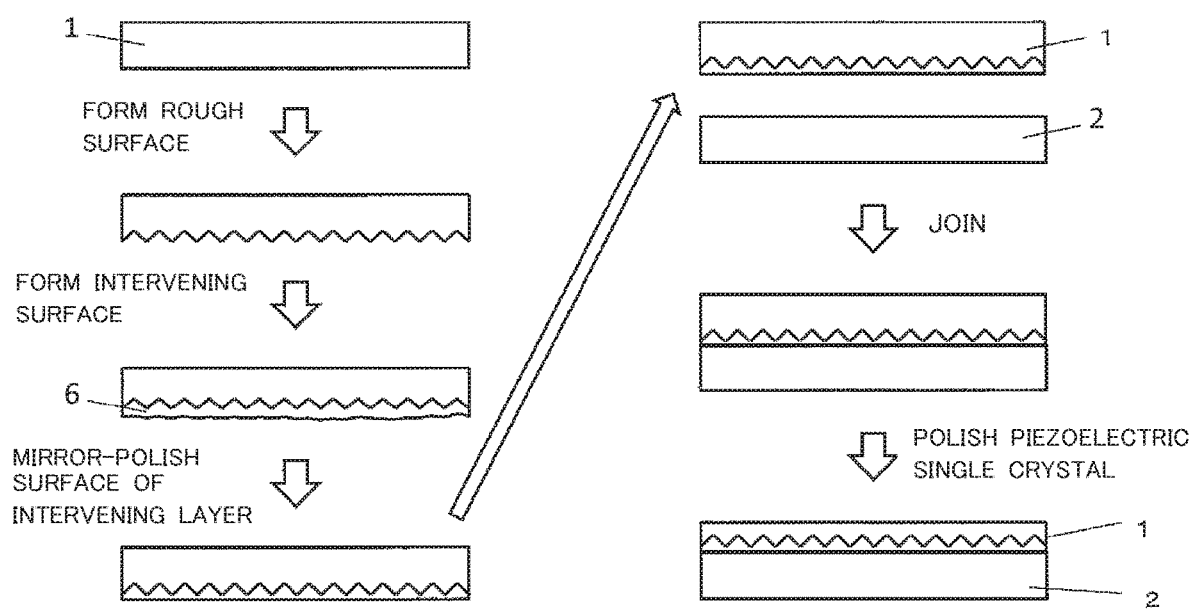
FIG. 17 is a view showing an aspect in which only the surface of the piezoelectric single crystal substrate 1 is roughened (to form an uneven structure), inorganic material 6 is formed as an intervening layer on the roughened surface, and the surface of the intervening layer is mirror-polished to produce a composite substrate.
Figure 18:
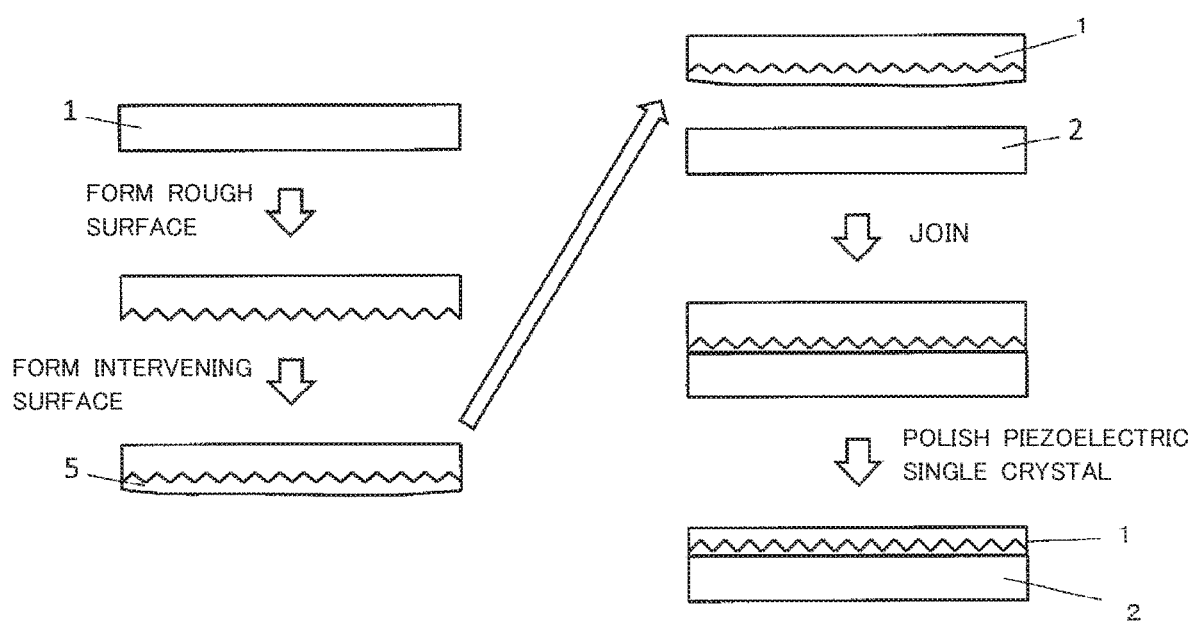
FIG. 18 is a view showing an aspect in which only the surface of the piezoelectric single crystal substrate 1 is roughened (to form an uneven structure), and an adhesive 5 is formed as an intervening layer on the roughened surface to form a composite substrate.
Figure 19:
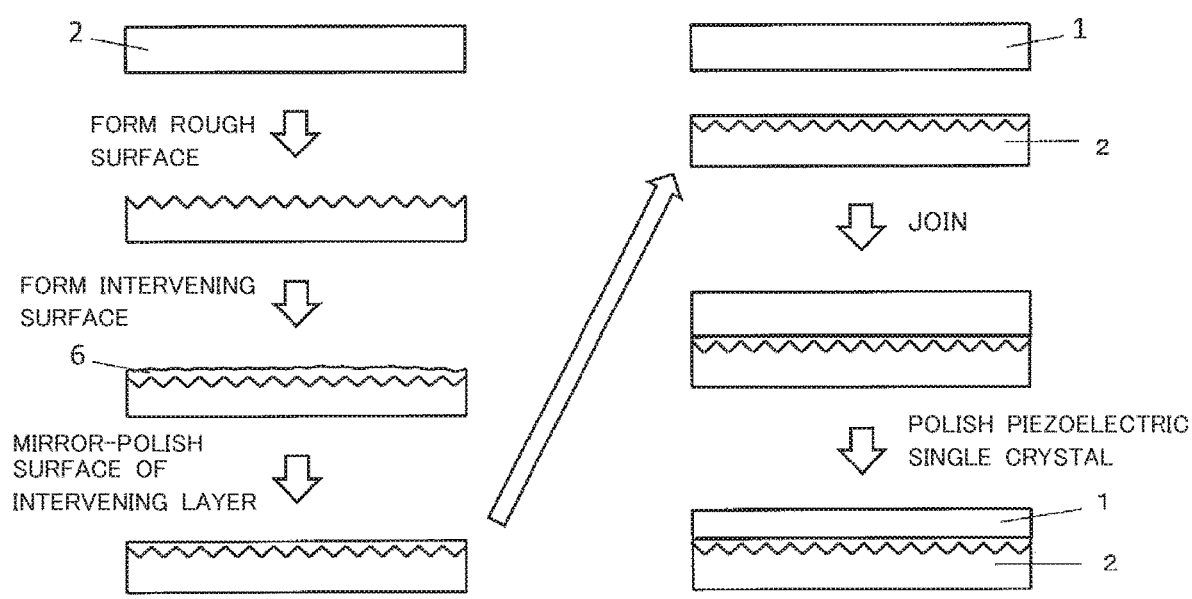
FIG. 19 is a view showing an aspect in which only the surface of the support substrate 2 is roughened, the inorganic material 6 is formed as an intervening layer on the roughened surface, and the surface of the intervening layer is mirror-polished to produce a composite substrate.

A composite substrate in which one or both of the piezoelectric single crystal substrate 1 and the support substrate 2 has an uneven structure at a portion 4 of the joined interface between the piezoelectric single crystal substrate 1 and the support substrate 2 can be produced through the processes shown in FIGS. 16 to 19. FIG. 16 shows a method of producing a composite substrate in which both the piezoelectric single crystal substrate 1 and the support substrate 2 have uneven structures, FIGS. 17 and 18 show a method of producing a composite substrate in which the piezoelectric single crystal substrate 1 has an uneven structure, and FIG. 19 shows a method of producing a composite substrate in which the support substrate 2 has an uneven structure.

In any cases of FIGS. 16 to 19, when producing the composite substrate, the piezoelectric single crystal substrate 1 having a rough surface (uneven structure) and/or the support substrate 2 having a rough surface (uneven structure) is first provided. These substrates may be joined with each other using the adhesive 5. Preferably, an intervening layer of the inorganic material 6 is formed and then the substrates are joined with each other. In this case, or the like is deposited on the rough surface (uneven structure) of the piezoelectric single crystal substrate 1 and/or the support substrate 2.

As the method of depositing $SiO_2$ or the like, for example, a plasma enhanced chemical vapor deposition (PE-CVD) method or a physical vapor deposition (PVD) method typified by sputtering can be used. Further, silane such as alkoxide silane, silazane such as hexamethyldisilazane, polysilazane such as perhydropolysilazane, silicone oligomer such as silicone oil, and a solution of each of these substances may be applied onto a wafer and the wafer may be cured by a heat treatment.

In the case where $SiO_2$ or the like is deposited under high temperature, warping or cracking occurs when the temperature is returned to room temperature. Thus, it is preferable to form the intervening layer 3 at a temperature close to room temperature. The temperature of the step is set to 70° C. or lower so that warping of the substrate can be suppressed to the extent that the substrate can be adsorbed to the vacuum chuck. Specifically, a room temperature CVD method, a magnetron sputtering method or the like is preferably used.

When a large amount of impurities (such as hydrogen and moisture) are contained in the intervening layer 3, a volatile component, called outgas is generated and the reliability is lowered. Therefore, it is necessary to form an intervening layer whose purity is as high as possible.

As described above, the intervening layer of the inorganic material 6 is deposited on the rough surface (uneven structure) of the piezoelectric single crystal substrate 1 and/or the support substrate 2, and then the surface of the substrate is mirror-polished. Then, for example, in the case where the mirror surface of the intervening layer of the inorganic material 6 formed on the piezoelectric single crystal substrate 1 is bonded to the mirror surface of the intervening layer of the inorganic material 6 formed on the support substrate 2 through the production process shown in FIG. 16, a composite substrate is obtained in which both the piezoelectric single crystal substrate 1 and the support substrate 2 have uneven structures, as shown in FIG. 20(A).

Figure 20:
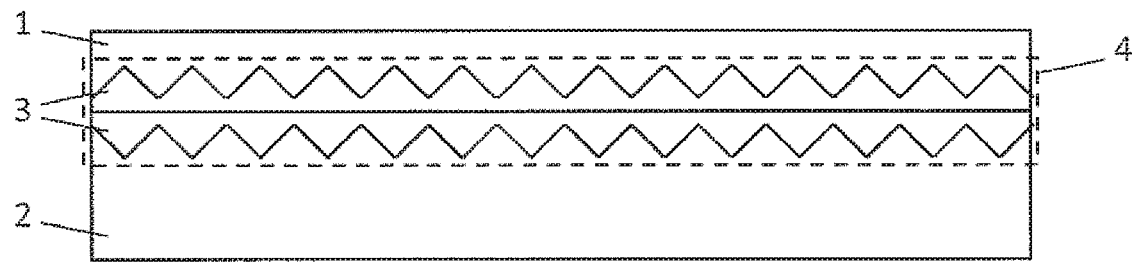
FIG. 20 is a view showing various aspects of the structure of the joined interface portion of the composite substrate of the present invention.
Figure 20:
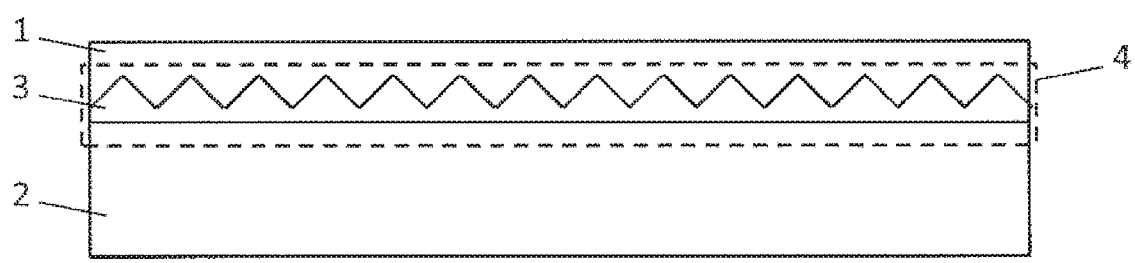
Figure 20:
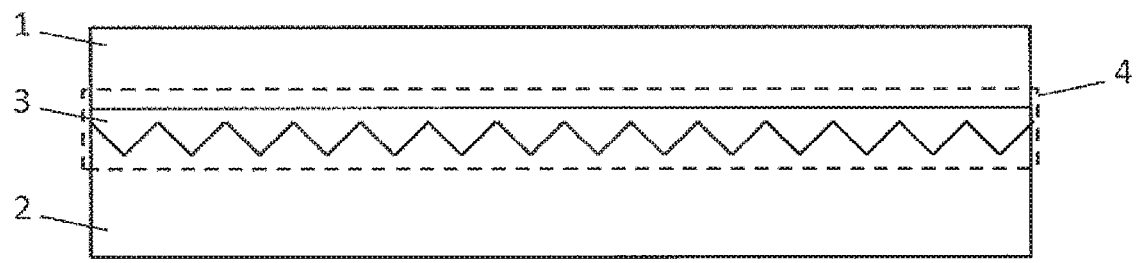
Figure 21:
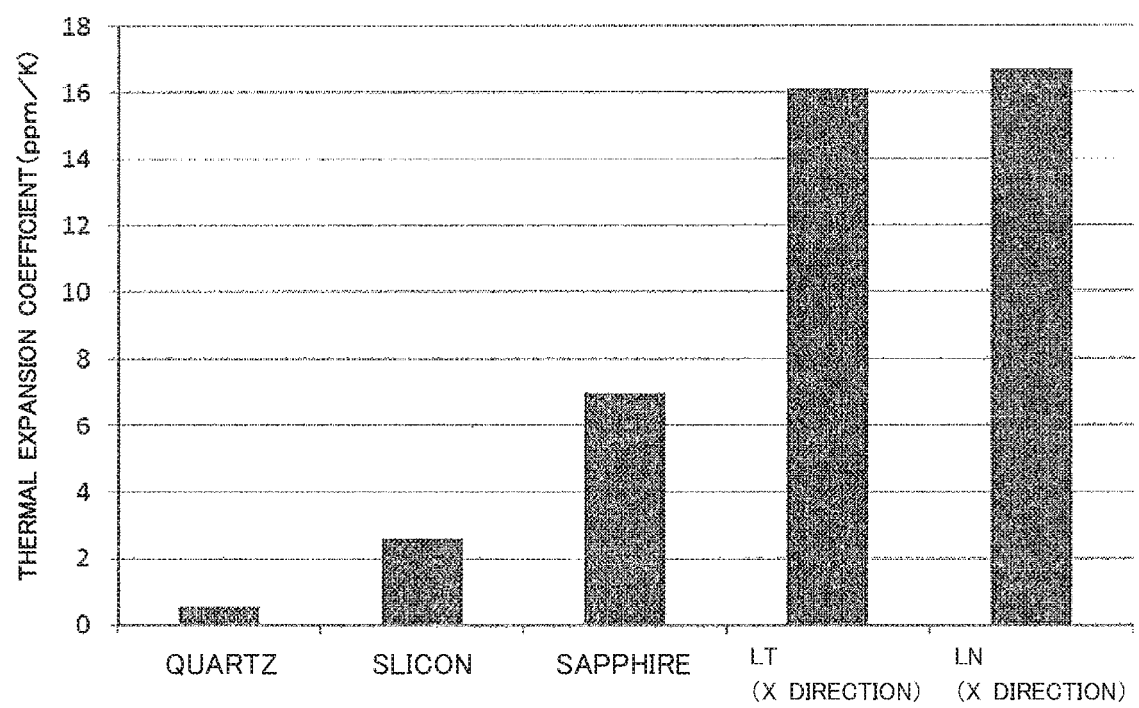
FIG. 21 is a graph showing a comparison among the thermal expansion coefficients of respective materials.
Figure 22:
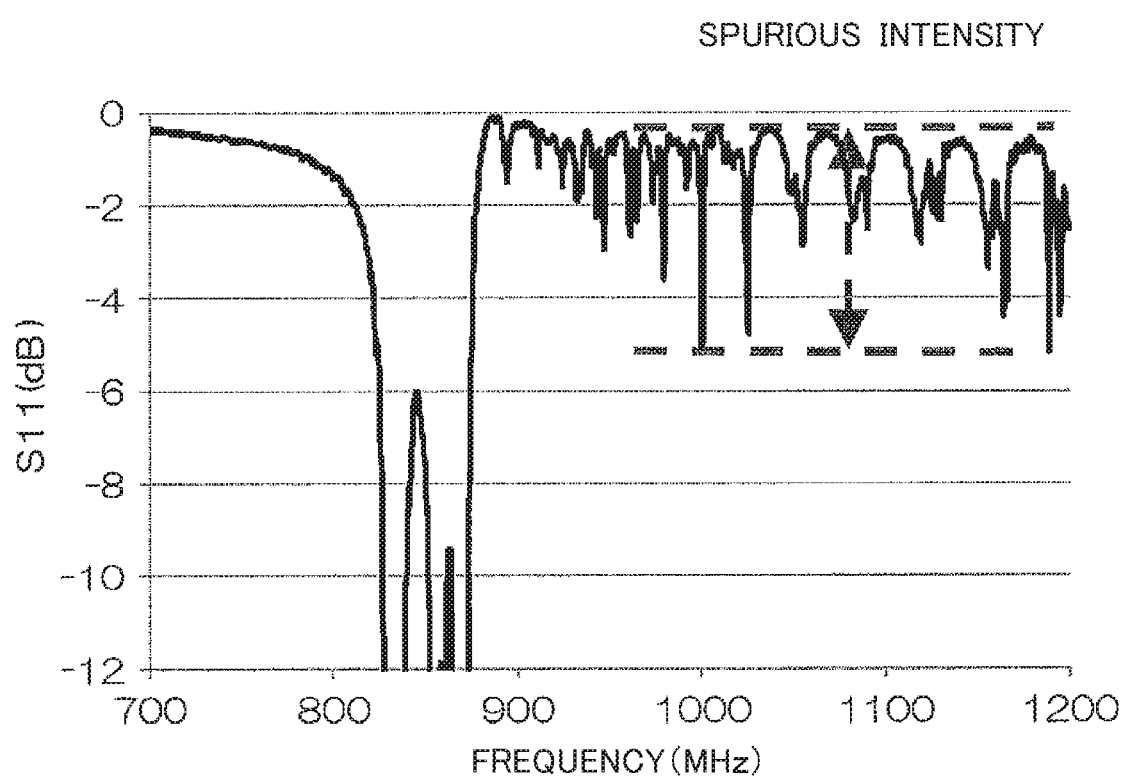
FIG. 22 is a graph showing S11 (reflection characteristics) of a four-stage ladder filter produced using a composite substrate made of a Si substrate and a 20 μm-thick LT substrate.
Figure 23:
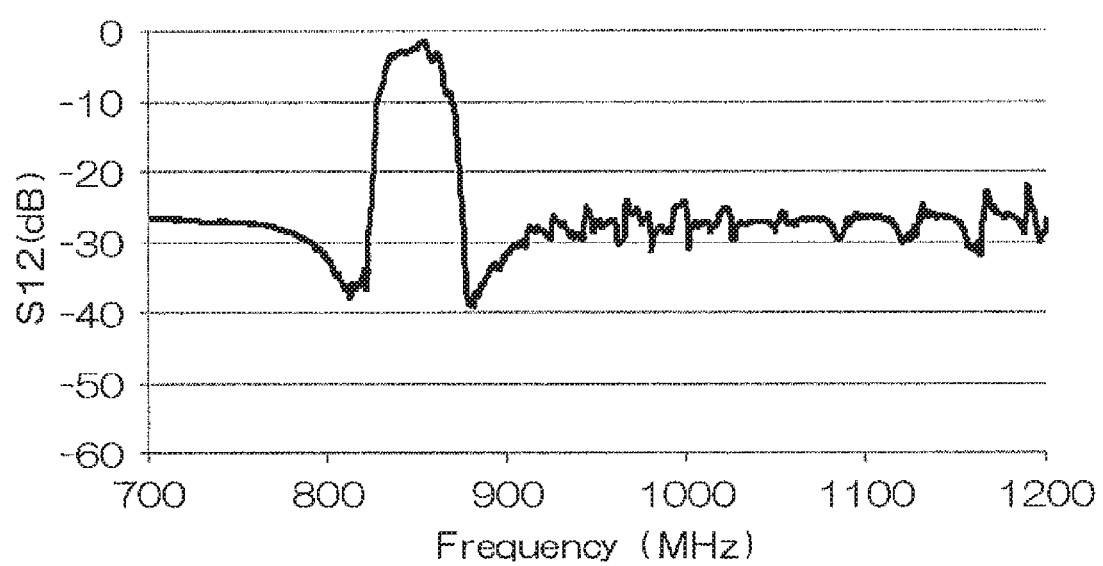
FIG. 23 is a graph showing S12 (insertion loss) of the four-stage ladder filter produced using the composite substrate made of the Si substrate and the 20 μm-thick LT substrate.
Figure 24:
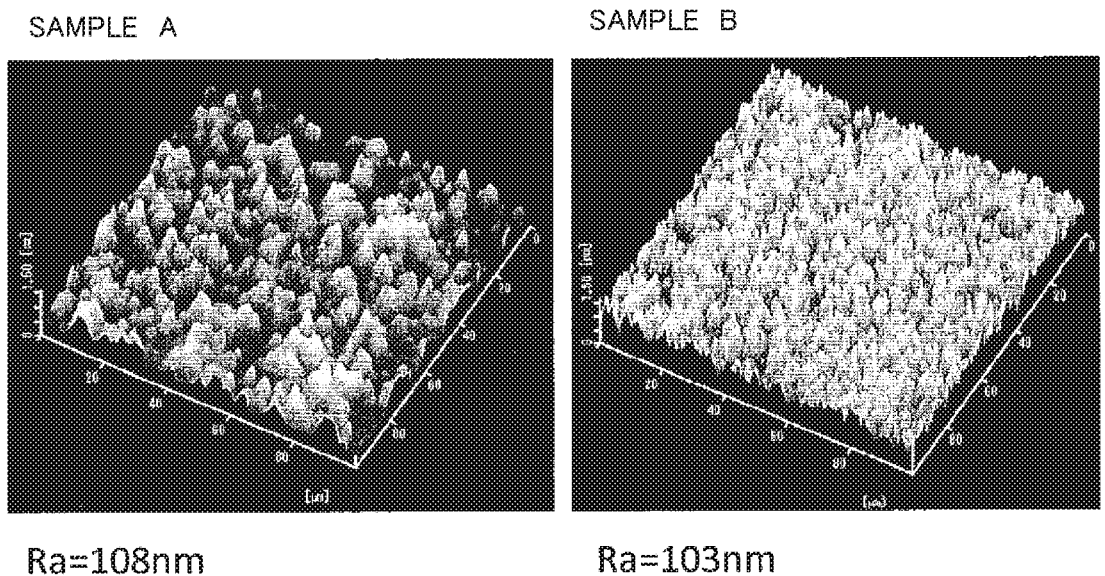
FIG. 24 shows a comparison of spurious intensity between LT substrates having the same degree of arithmetic average roughness Ra.
Figure 24:
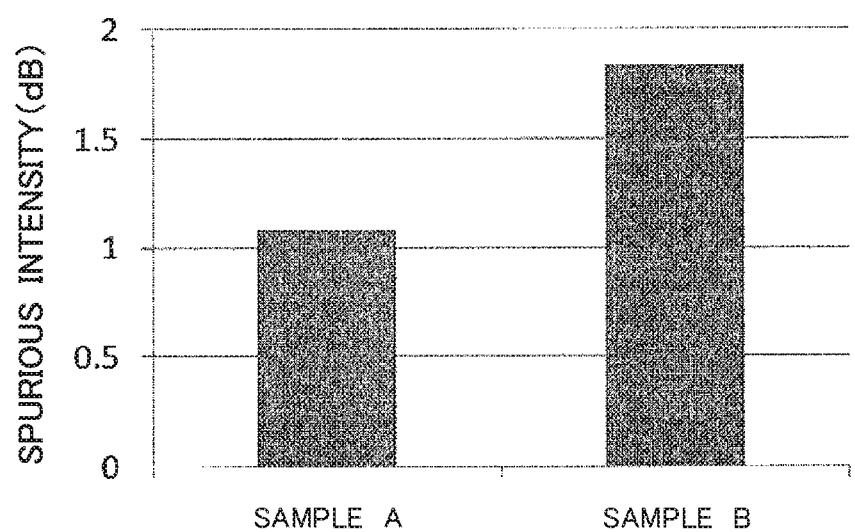

Further, as shown in FIG. 17, in the case where the uneven structure is formed only on the surface of the piezoelectric single crystal substrate 1, the intervening layer of the inorganic material 6 is formed thereon and is mirror-polished, and the resulting mirror surface is bonded to the mirror surface of the support substrate 2, a composite substrate is obtained in which the piezoelectric single crystal substrate 1 has the uneven structure at the portion 4 of the joined interface between the piezoelectric single crystal substrate 1 and the support substrate 2, as shown in FIG. 20(B).

At this time, as shown in FIG. 18, a composite substrate can also be obtained using the adhesive 5 as the intervening layer. Further, as shown in FIG. 19, in the case where an uneven structure 3 is formed only on the surface of the support substrate 2, and the intervening layer of the inorganic material 6 is formed thereon and is mirror-polished, and the resulting mirror surface is bonded to the mirror surface of the piezoelectric single crystal substrate 1, a composite substrate is obtained in which the support substrate 2 has the uneven structure at the portion 4 of the joined interface, as shown in FIG. 20(C).

In the case of producing a composite substrate in which only one of the piezoelectric single crystal substrate 1 and the support substrate 2 has the uneven structure, the uneven structure is formed on a substrate material having a thermal expansion coefficient closer to that of the material of the intervening layer 3. As a result, it is easy to suppress occurrence of cracking and warping when the intervening layer 3 is deposited on the uneven structure of the substrate.

The intervening layer 3 may have a multilayer structure of the same or different materials, and the intervening layer 3 preferably includes thermally oxidized silica and/or silica heat-treated at a temperature of 800° C. or higher.

In the case of using a silicon substrate as the support substrate 2, it is possible to form silica suitable for use as the intervening layer 3 by various methods. For example, the silicon substrate is heat-treated at 800 to 1100° C. in an oxygen atmosphere so that thermally oxidized silica with a thickness of from about 1 nm to about 1 μm can be formed on the surface of the silicon substrate.

Further, the above silica can be formed by depositing silica on the substrate by the CVD method or the PVD method and heat-treating the silica at a temperature of 800° C. or higher. Alternatively, an organosilicon compound is applied to the substrate and the resulting substrate may be heat-treated at a temperature of 800° C. or higher.

Even in the case where the piezoelectric single crystal substrate 1 or the support substrate 2 has no uneven structure, the intervening layer may be formed on the surface of the piezoelectric single crystal substrate 1 or the support substrate 2. Particularly, on the support substrate 2, thermally oxidized silica and/or silica heat-treated at a temperature of 800° C. or higher is preferably formed as the intervening layer.

It is difficult to heat-treat the intervening layer 3 formed on the surface of the piezoelectric single crystal substrate 1 at a high temperature due to the Curie temperature of the piezoelectric single crystal and the difference in thermal expansion coefficient between the piezoelectric single crystal and the intervening layer 3. Therefore, outgas is generated in the subsequent step including operation such as heating and cooling, and thus there is a concern that peeling may occur at the bonded interface.

However, the silica as described above is dense, contains little impurities, and can absorb a certain amount of gas. Accordingly, even in the case where outgas is generated from the intervening layer 3 formed on the surface of the piezoelectric single crystal substrate 1, when the intervening layer 3 contains thermally oxidized silica or silica heat-treated at a temperature of 800° C. or higher, such gas is absorbed. Thus, the occurrence of peeling can be suppressed.

When depositing the intervening layer 3 on the uneven structure of the piezoelectric single crystal substrate 1 and/or the support substrate 2, in order to fill up the uneven structure, the layer is preferably deposited so as to be thicker than the maximum height roughness Rz with reference to the lowest position of the uneven structure.

The maximum height roughness Rz is a sum of a maximum value of a peak height Rp and a maximum value of a valley depth Rv in a contour (roughness) curve at the reference length, and is defined in JIS B 0601: 2001 and ISO 4287: 1997. The measurement can be performed using an atomic force microscope (AFM) or the like.

The smaller the thickness of the intervening layer 3 is, the higher the Q value is, the more the temperature characteristics are improved, the more excellent the heat resistance is. Thus, this is preferable. Particularly, it is preferable that the thickness is equal to or less than 1.0 times the wavelength λ of the surface acoustic wave when the substrate is used as a surface acoustic wave device. The thickness of the intervening layer here is based on the average line of the contour (roughness) curve in the uneven structure. When the thickness of the intervening layer is large, a large shearing stress is generated due to a difference in thermal expansion between the piezoelectric substrate and the support substrate, particularly in the vicinity of the outer peripheral portion of the intervening layer, which may cause peeling.

In the uneven structure of at least one of the piezoelectric single crystal substrate 1 and/or the support substrate 2, a ratio of an average length RSm of elements in the contour (roughness) curve of the uneven structure to a wavelength λ of a surface acoustic wave when the substrate is used as a surface acoustic wave device is equal to or more than 0.2 and equal to or less than 7.0.

Here, the average length RSm of elements in the contour (roughness) curve of the uneven structure can be measured using AFM or the like, and is an average length RSm of the roughness curve elements defined in JIS B 0601: 2001 and ISO 4287: 1997.

The average length RSm is represented by the following Formula (1) and is an average of lengths Xs of the roughness curve elements in the reference length.

$$RSm = \frac{1}{m}\sum_{i=1}^{m} Xsi \qquad (1)$$

At this time, it is necessary to discriminate between the minimum height and the minimum length which are determined as a peak and a valley, respectively. The standard value of minimum distinguishable height is 10% of the maximum height roughness Rz. Further, the standard value of minimum distinguishable length is 1% of the reference length. The peak and the valley are determined so as to satisfy both of the two conditions, and then the average length of the roughness curve elements is found. Thus, the average length RSm is obtained.

The wavelength λ of the surface acoustic wave when the substrate is used as a surface acoustic wave device is determined by the frequency of the electric signal input to the composite substrate (surface acoustic wave device) and the velocity of the surface wave (leaky wave). The velocity of the surface wave varies depending on the material, and it is about 4000 m/s for $LiTaO_3$. Therefore, in the case of producing a 2 GHz surface acoustic wave device from a composite substrate obtained by using $LiTaO_3$ as the piezoelectric single crystal substrate 1, the wavelength λ of the surface acoustic wave is about 2 μm.

Further, in the case of producing an 800 MHz surface acoustic wave device, the wavelength of the surface acoustic wave is about 5 μm.

In the present invention, the ratio of the average length RSm of elements in the cross-sectional curve of the uneven structure to the wavelength λ of the surface acoustic wave when the substrate is used as a surface acoustic wave device is expressed as RSm/λ. When this value is equal to or more than 0.2 and equal to or less than 7.0, it is possible to effectively reduce the spurious.

The arithmetic average roughness Ra in the cross-sectional curve of the uneven structure is not particularly limited. However, it is considered that when the value of Ra is too small, the effect of reducing spurious cannot be sufficiently obtained. Thus, the value of Ra is preferably equal to or more than 100 nm.

Meanwhile, when the value of Ra is too large, it takes time and cost to form the intervening layer 3, and it is also difficult to uniformly polish the surface. This is not preferable from the viewpoint of production, and thus the value of Ra is preferably equal to or less than 1000 nm.

The method of forming the uneven structure on the surface of the piezoelectric single crystal substrate 1 and/or the support substrate 2 is not particularly limited. Abrasive grains and grinding stones are selected and polishing may be performed so as to achieve the desired surface roughness. Alternatively, dry/wet etching may be used.

Particularly, when a silicon single crystal substrate is used as the support substrate 2 and an uneven structure is formed on the substrate, it is preferable to perform wet etching using an alkaline solution. A (100)-oriented silicon substrate is immersed in a strong alkaline solution such as NaOH or KOH and treated with ultrasonic waves or the like. As a result, anisotropic etching progresses and a pyramid-shaped uneven structure is obtained. The size of the pyramid-shaped uneven structure can be easily controlled by changing the temperature and the immersion time.

The present invention is considered to be applicable to any composite substrate as long as is a composite substrate for surface acoustic wave device in which spurious is a problem, regardless of the type of piezoelectric material. The piezoelectric single crystal substrate 1 is preferably a lithium tantalate single crystal substrate having a large electromechanical coupling coefficient or a lithium niobate single crystal substrate having a large electromechanical coupling coefficient.

Particularly, when the lithium tantalate single crystal substrate is used as the piezoelectric single crystal substrate 1, it is preferable to use a rotated Y-cut lithium tantalate single crystal substrate whose crystal orientation is rotated from 36° Y through 49° Y cut.

A lithium tantalate single crystal substrate whose Li concentration is roughly uniform in its thickness direction or a lithium niobate single crystal substrate whose Li concentration is roughly uniform in its thickness direction may be used. The Li concentration of each of the substrates may be a roughly congruent composition or a pseudo stoichiometric composition. A piezoelectric single crystal substrate having a roughly congruent composition is preferable in that it can be relatively easily produced by a known method such as the Czochraiski method. Meanwhile, a piezoelectric single crystal substrate having a pseudo stoichiometric composition in which the ratio of Li to Ta or Nb is Li:Ta=50−α:50+α or Li:Nb=50−α:50+α, and α is in a range of −1.0<α<2.5 is preferable because it exhibits a high mechanical coupling coefficient and excellent temperature characteristics.

In the case where the Li concentration of the piezoelectric single crystal substrate is set to a pseudo stoichiometric composition, a piezoelectric single crystal substrate having a pseudo stoichiometric composition produced by a known double crucible method may be used. Also, the piezoelectric single crystal substrate can be produced by the following method.

That is, this is a method of subjecting a piezoelectric single crystal substrate having a roughly congruent composition obtained by a known method such as the Czochraiski method to a vapor phase treatment for diffusing Li from the surface of the substrate to the inside of the substrate. Specifically, the method can be performed in such a manner that a lithium tantalate single crystal substrate is buried in a powder containing $Li_3TaO_4$ as a main component and heat-treated.

The piezoelectric single crystal substrate having the pseudo stoichiometric composition can be obtained by the above treatment. In order to allow the entire substrate to have the pseudo stoichiometric composition, it is necessary to perform the vapor phase treatment for a relatively long time. Thus, this may cause warping or cracking of the substrate.

In that case, the vapor phase treatment is performed for a relatively short time, as a result of which a piezoelectric single crystal substrate having a Li concentration which varies in the thickness direction of the piezoelectric single crystal substrate is obtained. In the piezoelectric single crystal substrate, when the Li concentration at an arbitrary depth from the surface of the substrate is a pseudo stoichiometric composition, the piezoelectric single crystal substrate is bonded to a support substrate and the remaining piezoelectric single crystal substrate is removed so as to leave a portion with the pseudo stoichiometric composition. As a result, a composite substrate is obtained in which the Li concentration of the piezoelectric single crystal substrate is roughly uniform in the thickness direction and is a pseudo stoichiometric composition.

Further, a lithium tantalate single crystal substrate having a Li concentration which varies in its thickness direction or a lithium niobate single crystal substrate having a Li concentration which varies in its thickness direction may be used.

At this time, the Li concentration at the side of the joined interface between the piezoelectric single crystal substrate and the support substrate is made larger than the Li concentration at a surface at an opposite side of the interface side, whereby the acoustic wave energy concentrates in a region where the Li concentration is small and the Q value of the resonator made of the composite substrate is increased. Thus, this is preferable.

Further, it is possible to obtain a pseudo stoichiometric composition in which the ratio of Li to Ta or Nb at the side of the joined interface between the piezoelectric single crystal substrate and the support substrate is Li:Ta=50−α: 50+α or Li:Nb=50−α:50+α, and α is in a range of −1.0<α<2.5.

A piezoelectric single crystal substrate having a Li concentration which varies in its thickness direction is obtained by subjecting a piezoelectric single crystal substrate having a roughly congruent composition to a vapor phase treatment for diffusing Li from the surface of the substrate to the inside of the substrate in the same manner as described above. Then, the piezoelectric single crystal substrate is bonded to a support substrate, and the remaining piezoelectric single crystal substrate is removed so as to expose a surface whose Li concentration is smaller than that at the side of the portion of the joined interface between the piezoelectric single crystal substrate and the support substrate. As a result, a composite substrate having a Li concentration which varies in its thickness direction is obtained.

The lithium tantalate single crystal substrate used as the piezoelectric single crystal substrate may be doped with Fe at a concentration of from 25 ppm to 150 ppm. The Li diffusion rate of the lithium tantalate single crystal substrate doped with Fe improves by about 20%. Accordingly, in the case of producing a composite substrate by, for example, the above-described method, involving the Li diffusion treatment, the productivity is improved. Thus, this is preferable. In addition, since it is possible to shorten the time for the Li diffusion treatment, the occurrence of warping and cracking of the substrate can also be suppressed.

The Li concentrations of the lithium tantalate single crystal substrate and the lithium niobate single crystal substrate may be measured by a known method. For example, the Li concentrations can be evaluated by Raman spectroscopy. In the case of the lithium tantalate single crystal substrate, it is known that there is an approximately linear relationship between the half width of the Raman shift peak and the Li concentration (Li/(Li+Ta) value). Therefore, a formula expressing the relationship is used so that it is possible to evaluate the composition of the oxide single crystal substrate at an arbitrary position.

A formula expressing a relationship between the half width of the Raman shift peak and the Li concentration can be obtained by measuring the an half width of some samples whose compositions are known and whose Li concentrations are different; if the conditions of the Raman measurement are identical, it is also possible to use a formula that has been already publicized in a literature.

For example, in the case of lithium tantalate single crystal, the following Formula (2) may be used (refer to 2012 IEEE International Ultrasonics Symposium Proceedings, Page(s): 1252-1255).

$$Li/(Li+Ta) = (53.15 - 0.5 \, FWHM1)/100 \quad (2)$$

Here, "FWHM1" is the half width of the Raman shift peak around 600 cm$^{-1}$. Please refer to the literature for details of measurement conditions.

Although the material of the support substrate 2 is not particularly limited, it is preferably a material having a smaller thermal expansion coefficient than that of the piezoelectric material to be joined. The material is preferably any one of silicon, glass, quartz, alumina, sapphire, silicon carbide, and silicon nitride.

A composite substrate is formed by bonding the piezoelectric single crystal substrate 1 to the support substrate 2, and further the substrate may be thinned by an arbitrary method such as a grinding method or a polishing method. At this time, when the thickness of the piezoelectric single crystal substrate 1 is too large, the effect of suppressing thermal expansion by bonding to the support substrate 2 is reduced. Thus, there are concerns about deterioration of temperature characteristics and an increase in warping. Therefore, the thickness of the piezoelectric single crystal substrate 1 in the composite substrate is preferably equal to or less than 100 μm, and more preferably equal to or less than 80 μm.

There is a tendency that the smaller the thickness of the piezoelectric single crystal substrate 1 is, the lower the spurious intensity is, the more the temperature characteristics are improved, the more excellent the heat resistance is. Thus, this is preferable.

Further, in the case where the thickness of the piezoelectric single crystal substrate 1 is equal to or more than 1.0 and equal to or less than 3.5 times the wavelength λ of the surface acoustic wave when the substrate is used as a surface acoustic wave device, although depending on the thickness of the intervening layer, it is possible to increase the Q value. Thus, this is preferable. The thickness is more preferably equal to or more than 1.5 times and equal to or less than 3.0 times the wavelength λ.

As described above, in the case where the thickness of the piezoelectric single crystal substrate 1 is equal to or more than 1.0 times and equal to or less than 3.5 times the wavelength λ of the surface acoustic wave when the substrate is used as a surface acoustic wave device, when the thickness of the intervening layer is equal to or less than 1.2 times the wavelength λ, the layer has heat resistance up to about 250° C. Thus, this is preferable. The thickness is more preferably equal to or less than 1.0 times.

The composite substrate for surface acoustic wave device is used to produce a surface acoustic wave device, so that it is possible to configure the surface acoustic wave device having less spurious and good temperature characteristics.

EXAMPLES

Hereinafter, examples of the present invention will be described more specifically.

Example 1

In Example 1, first, a plurality of LT substrates having uneven structures with the same degree of arithmetic average roughness Ra (Ra=300 nm±10%) and different average lengths RSm was provided. The uneven structures of the LT substrates were formed by polishing the substrates using different free abrasive grains.

Next, an about 10 μm-thick SiO$_2$ layer was deposited on the uneven structure-formed surface of each of the LT substrates using the plasma CVD method at 35° C., and then the SiO$_2$ deposited surface was polished to form a mirror surface.

Then, both the SiO$_2$ mirror surface and the mirror surface of the Si substrate serving as the support substrate were subjected to plasma surface activation and bonded to each other. Further, each of the LT substrates was polished to be thinned to a thickness of 20 µm, and thus composite substrates were produced.

In addition, a 0.4 µm-thick Al film was formed on the surface at the side of the LT substrate of each of the produced composite substrates by sputtering, and further electrodes were formed by photolithography, thereby producing a four-stage ladder filter with a wavelength of about 5 µm made of two parallel resonators and four series resonators. At this time, a g-line stepper was used for photolithography exposure and a mixed gas of Cl$_2$, BCl$_3$, N$_2$, and CF$_4$ was used for Al etching.

Finally, S11 (reflection characteristics) and S12 (insertion loss) of the produced four-stage ladder filter were measured using a network analyzer. Then, the difference between the peaks and valleys of the observed spurious was evaluated as the spurious intensity.

FIG. 1 shows the evaluation results of the four-stage ladder filter made of each of the composite substrates. The horizontal axis is RSm/λ, and λ is equal to 5 µm. Also, the vertical axis is the spurious intensity.

According to the results, it can be seen that the spurious can be effectively reduced when the value of RSm/λ is equal to or more than 0.2 and equal to or less than 7.0. This is because when the value of RSm representing the pitch of the uneven structure is too large, scattering of a wave due to the unevenness of the joined interface is unlikely to occur, whereas when the value of RSm is too small, the wave having the wavelength is less influenced by the unevenness.

Further, a four-stage ladder filter with a wavelength of about 2 µm was produced using the same composite substrates and was evaluated. The filter showed the same tendency as in the case of a wavelength of about 5 µm.

Further, a wafer having an RSm/λ value of 0.2 among the composite substrates was diced into 2 mm square pieces. A heat resistance test was performed in such a manner that each of the diced wafers was moved back and forth on a hot plate at 200° C. and a metal cooling stage (held for 30 seconds on each of the hot plate and the cooling stage) and the test was investigated. After the fifth back and forth movement, peeling at the circumference of each of the wafers was observed. According to the results, it can be seen that the composite substrate of Example 1 has a certain degree of heat resistance.

Example 1'

In Example 1', first, a plurality of LT substrates having uneven structures with the same degree of arithmetic average roughness Ra (Ra=300 nm±10%) and different average lengths RSm was provided. The uneven structures of the LT substrates were formed by polishing the substrates using different free abrasive grains.

Next, an about 10 µm-thick SiO$_2$ layer was deposited on the uneven structure-formed surface of each of the LT substrates using the plasma CVD method at 35° C., and then the SiO$_2$ deposited surface was polished to form a mirror surface.

The Si substrate serving as the support substrate was subjected to a heat treatment at 850° C. in an oxygen atmosphere and thus thermally oxidized silica was formed on the surface of the Si substrate. At this time, the thicknesses of thermally oxidized silica provided were 100 nm, 250 nm, and 500 nm, respectively.

Then, both the SiO$_2$ mirror surface and the thermally oxidized silica formed on the surface of the Si substrate were subjected to plasma surface activation and bonded to each other. Further, each of the LT substrates was polished to be thinned to a thickness of 20 µm, and thus composite substrates were produced.

A four-stage ladder filter was produced using each of the produced composite substrates and was evaluated. The filter showed the same tendency as in the case of Example 1.

Further, a wafer having an RSm/λ value of 0.2 among the composite substrates was diced into 2 mm square pieces. A heat resistance test was performed in such a manner that each of the diced wafers was moved back and forth on a hot plate at 200° C. and a metal cooling stage (held for 30 seconds on each of the hot plate and the cooling stage) and the test was investigated. Each of the diced wafers was moved back and forth 100 times, however, no peeling was observed regardless of the thickness of thermally oxidized silica. A comparison between the results and the results of the heat resistance test in Example 1 shows that the thermal resistance of the composite substrate is dramatically improved by forming thermally oxidized silica on the surface of the Si substrate serving as the support substrate.

Example 2

Figure 2:
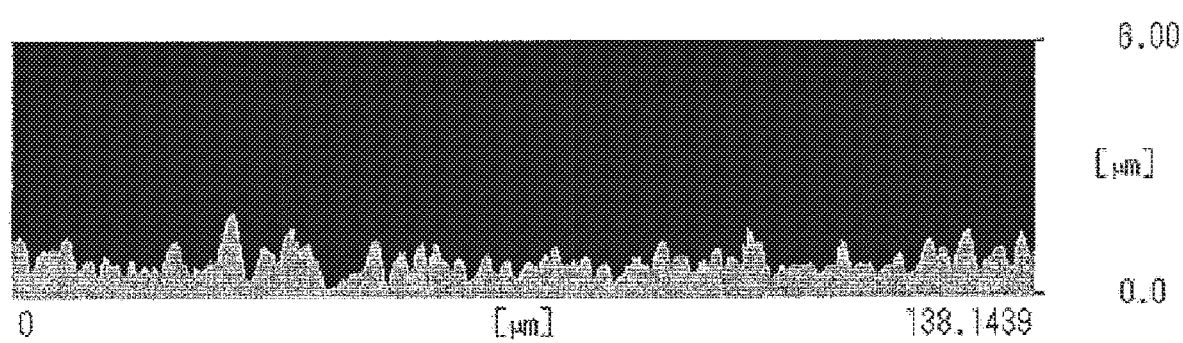
FIG. 2 is a cross-sectional profile of AFM of a Si substrate on which a pyramid-shaped uneven structure is formed.
Figure 3:
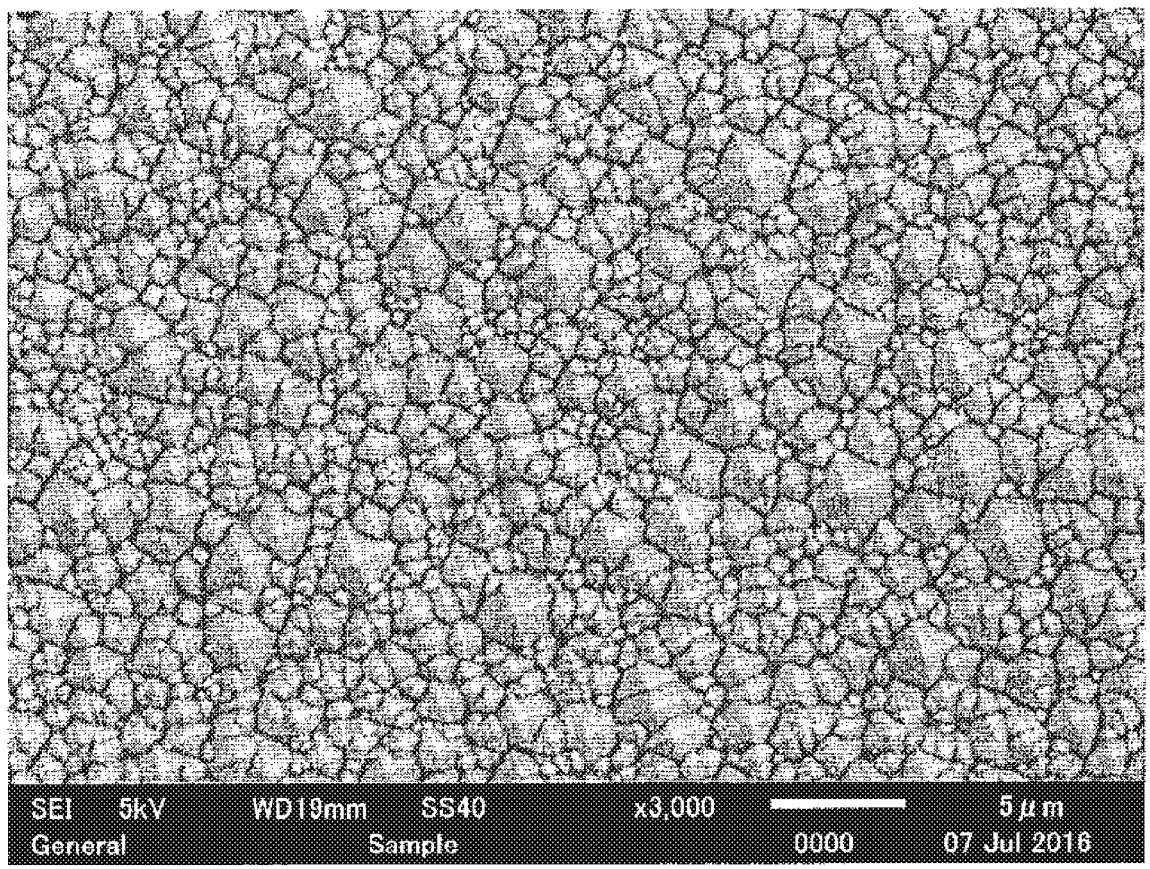
FIG. 3 is an SEM observation image of the Si substrate on which the pyramid-shaped uneven structure is formed.

In Example 2, first, a plurality of Si substrates having uneven structures with the same degree of arithmetic average roughness Ra (Ra=300 nm±10%) and different average lengths RSm was provided. The uneven structure of each of the Si substrates was formed by wet etching using an alkaline solution, and the uneven structure was controlled by changing the temperature and the immersion time. Thus, each of the Si substrates having a pyramid-shaped uneven structure formed thereon was obtained cross-sectional profile of AFM and an SEM observation image, each showing the Si substrate having the pyramid-shaped uneven structure formed thereon, are shown in FIG. 2 and FIG. 3, respectively.

Next, an about 10 µm-thick SiO$_2$ layer was deposited on the uneven structure-formed surface of each of the Si substrates using the plasma CVD method at 35° C., and then the SiO$_2$ deposited surface was polished to form a mirror surface.

Then, both the SiO$_2$ mirror surface and the mirror surface of the LT substrate serving as the piezoelectric single crystal substrate were subjected to plasma surface activation and bonded to each other. Further, the LT substrate was polished to be thinned to a thickness of 20 µm, and thus composite substrates were produced.

In addition, a 0.4 µm-thick Al film was formed on the surface at the side of the LT substrate of each of the produced composite substrates by sputtering, and further electrodes were formed by photolithography, thereby producing a four-stage ladder filter with a wavelength of about 5 µm made of two parallel resonators and four series resonators. At this time, a g-line stepper was used for photolithography exposure and a mixed gas of Cl$_2$, BCl$_3$, N$_2$, and CF$_4$ was used for Al etching.

Finally, S11 (reflection characteristics) and S12 (insertion loss) of the produced four-stage ladder filter were measured using a network analyzer. Then, the difference between the peaks and valleys of the observed spurious was evaluated as the spurious intensity.

Figure 4:
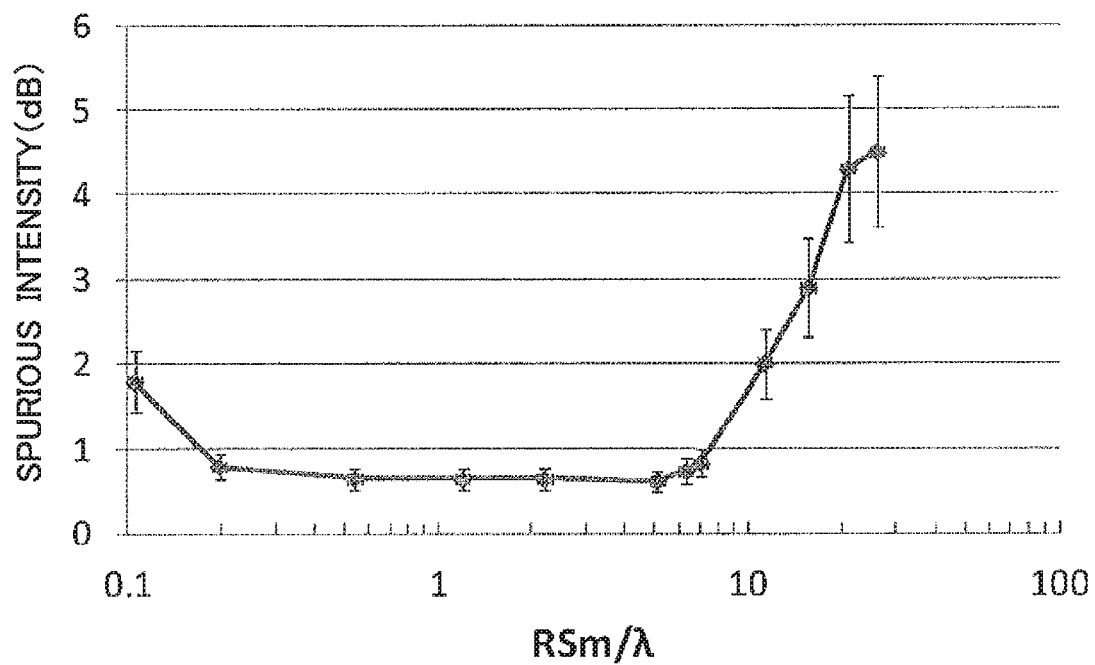
FIG. 4 is a graph showing a relationship between spurious intensity and RSm/λ in Example 2.

FIG. 4 shows the evaluation results of the four-stage ladder filter made of each of the composite substrates. The horizontal axis is RSm/λ, and λ is equal to 5 μm. Also, the vertical axis is the spurious intensity.

According to the results, it can be seen that the spurious can be effectively reduced when the value of RSm/λ is equal to or more than 0.2 and equal to or less than 7.0.

Further, a four-stage ladder filter with a wavelength of about 2 μm was produced using the same composite substrates and was evaluated. The filter showed the same tendency as in the case of a wavelength of about 5 μm.

Example 3

In Example 3, first, a plurality of LT substrates and a plurality of Si substrates, both of which had uneven structures with the same degree of arithmetic average roughness Ra (Ra=300 nm±10%) and different average lengths RSm, were provided. The uneven structures of the LT substrates were formed by polishing the substrates using different free abrasive grains. The uneven structure of each of the Si substrates was formed by wet etching using an alkaline solution, and the uneven structure was controlled by changing the temperature and immersion time. Thus, each of the Si substrates having a pyramid-shaped uneven structure formed thereon was obtained.

Next, an about 10 μm-thick $SiO_2$ layer was deposited on the uneven structure-formed surface of each of the LT substrate and the Si substrate using the plasma CVD method at 35° C., and then the $SiO_2$ deposited surface was polished to form a mirror surface.

Then, both the $SiO_2$ mirror surface of the LT substrate and the $SiO_2$ mirror surface of the Si substrate were subjected to plasma surface activation and bonded to each other. Further, each of the LT substrates was polished to be thinned to a thickness of 20 μm, and thus composite substrates were produced. In this case, the LT substrate and the Si substrate, both of which have approximately the same degree of RSm, are bonded to each other.

In addition, a 0.4 μm-thick Al film was formed on the surface at the side of the LT substrate of each of the produced composite substrates by sputtering, and further electrodes were formed by photolithography, thereby producing a four-stage ladder filter with a wavelength of about 5 μm made of two parallel resonators and four series resonators. At this time, a g-line stepper was used for photolithography exposure and a mixed gas of $Cl_2$, $BCl_3$, $N_2$, and $CF_4$ was used for Al etching.

Finally, S11 (reflection characteristics) and S12 (insertion loss) of the produced four-stage ladder filter were measured using a network analyzer. Then, the difference between the peaks and valleys of the observed spurious was evaluated as the spurious intensity.

Figure 5:
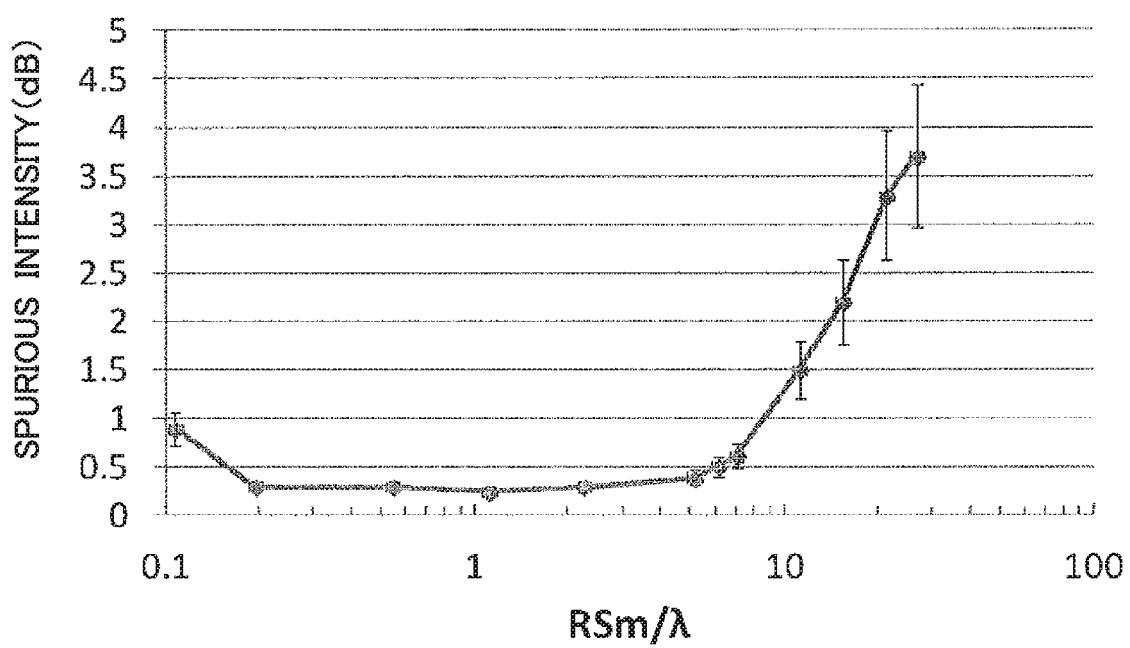
FIG. 5 is a graph showing a relationship between spurious intensity and RSm/λ in Example 3.

FIG. 5 shows the evaluation results of the four-stage ladder filter made of each of the composite substrates. The horizontal axis is RSm/λ, and λ is equal to 5 μm. Also, the vertical axis is the spurious intensity.

According to the results, it can be seen that the spurious can be effectively reduced when the value of RSm/λ is equal to or more than 0.2 and equal to or less than 7.0. The value of RSm used for this evaluation is the average value of RSm of the LT substrate and RSm of the Si substrate.

Further, a four-stage ladder filter with a wavelength of about 2 μm was produced using the same composite substrates and was evaluated. The filter showed the same tendency as in the case of a wavelength of about 5 μm.

Example 4

In Example 4, composite substrates were produced by replacing the LT substrate (which was used in Examples 1 to 3) with an LN substrate. A four-stage ladder filter was produced using each of the composite substrates and was evaluated. The filter showed the same tendency as in the cases of Examples 1 to 3.

Example 5

In Example 5, a plurality of LT substrates having uneven structures with the same degree of arithmetic average roughness Ra and the same degree of RSm (Ra=300 nm±10%, RSm=3 μm±10%, Rz=2.0 μm±10%) was produced. Here, the uneven structures of the LT substrates were formed by polishing the substrates using free abrasive grains.

Next, an about 10 μm-thick $SiO_2$ layer was deposited on the uneven structure-formed surface of each of the LT substrates using the plasma CVD method at 35° C., and then the $SiO_2$ deposited surface was polished to form a mirror surface.

At this time, the amount of polishing was changed depending on the LT substrate so that the thickness of $SiO_2$ was from 1.5 μm to 9.5 μm.

The Si substrate serving as the support substrate was subjected to a heat treatment at 850° C. in an oxygen atmosphere and thus a 500 nm-thick thermally oxidized silica layer was formed on the surface of the Si substrate.

Then, both the $SiO_2$ mirror surface and the thermally oxidized silica layer formed on the surface of the substrate were subjected to plasma surface activation and bonded to each other. Further, each of the LT substrates was polished and composite substrates were produced. At this time, the amount of polishing was changed depending on the substrate so that the thickness of the LT substrate was from 5 μm to 25 μm.

A four-stage ladder filter and a resonator (wavelength of the surface acoustic wave: 5 μm) were produced using the produced composite substrates and were evaluated.

S11 (reflection characteristics) and S12 (insertion loss) of the produced four-stage ladder filter were measured. Then, the difference between the peaks and valleys of the observed spurious was evaluated as the spurious intensity.

Figure 6:
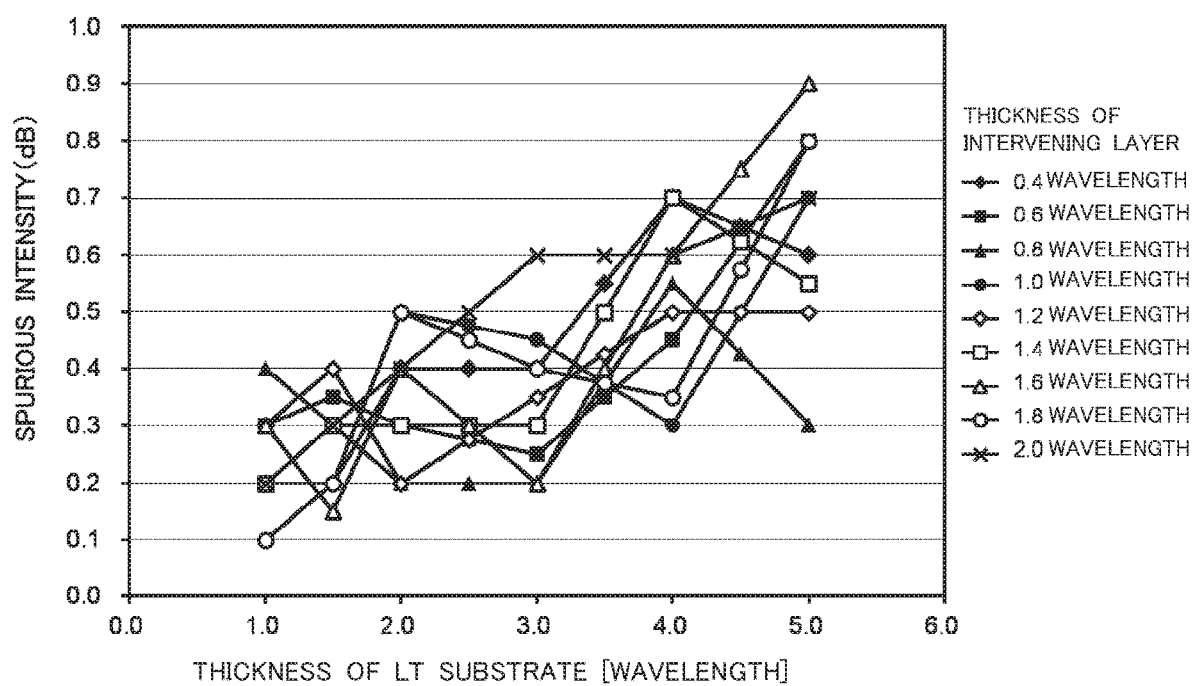
FIG. 6 is a graph showing a relationship between the thickness of each of the LT substrates in Example 5 and spurious intensity.

FIG. 6 shows the evaluation results of the four-stage ladder filter made of each of the composite substrates in which the thickness of the LT substrate is from 5 μm (1.0 wavelength) to 25 μm (5.0 wavelength) and the thickness of the intervening layer ($SiO_2$ and thermally oxidized silica) is from 2 μm (0.4 wavelength) to 10 μm (2.0 wavelength). The horizontal axis is the thickness of the LT substrate and the vertical axis is the spurious intensity.

According to the results, the spurious intensity is kept as low as 1.0 dB or less regardless of the thickness of the LT substrate and the thickness of the intervening layer.

Subsequently, the Q value of the produced resonator was obtained by the following Equation (3) (refer to 2010 IEEE International Ultrasonics Symposium Proceedings, Page(s): 861-863). Here, ω is the angular frequency, τ (f) is the group delay time, and Γ is the reflection coefficient measured by the network analyzer.

$$Q(f)=\omega*\tau(f)*|\Gamma|/(1-|\Gamma|^2) \quad (3)$$

Figure 7:
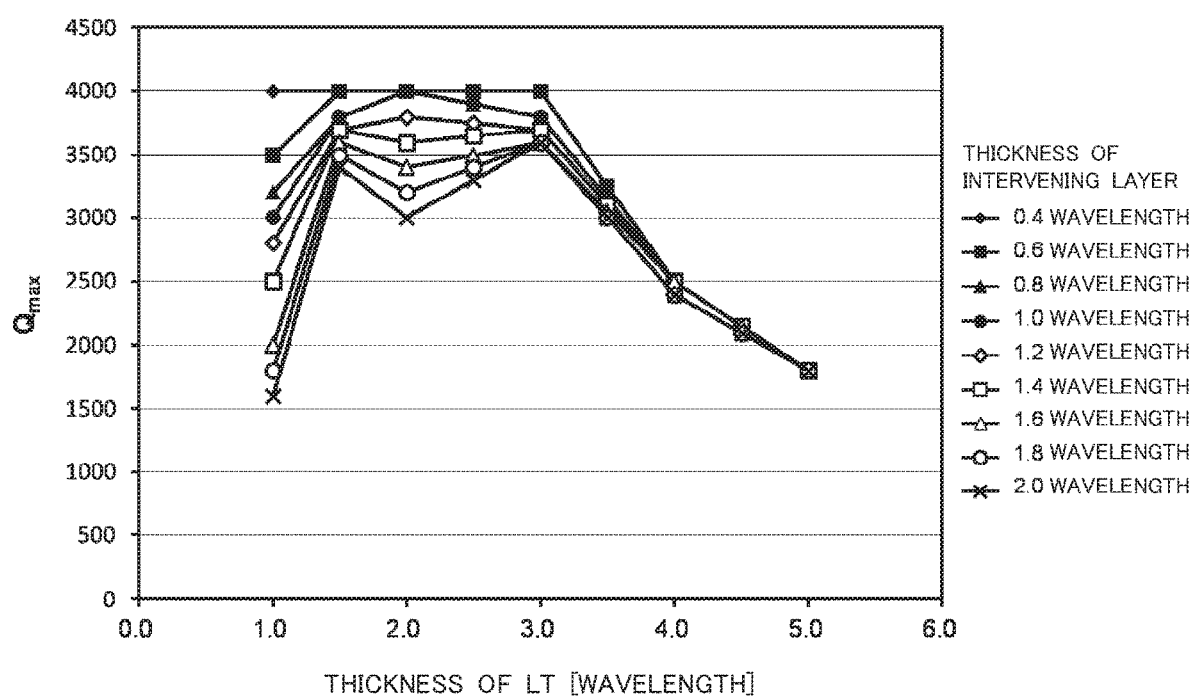
FIG. 7 is a graph showing a relationship between the thickness of each of the LT substrates in Example 5 and $Q_{max}$.

FIG. 7 shows the evaluation results of the Q value of the resonator made of each of the composite substrates in which the thickness of the LT substrate is from 5 μm (1.0 wavelength) to 25 μm (5.0 wavelength) and the thickness of the intervening layer ($SiO_2$ and thermally oxidized silica) is from 2 μm (0.4 wavelength) to 10 μm (2.0 wavelength). The horizontal axis is the thickness of the LT substrate and the vertical axis is the maximum value (Q max) of the Q value.

According to this result, it can be seen that the smaller the thickness of the intervening layer is, the higher the Q value is. Further, when the thickness of the LT substrate is set to less than 1.5 wavelength or set, to more than 3.0 wavelength, the Q value tends to decrease.

Figure 8:
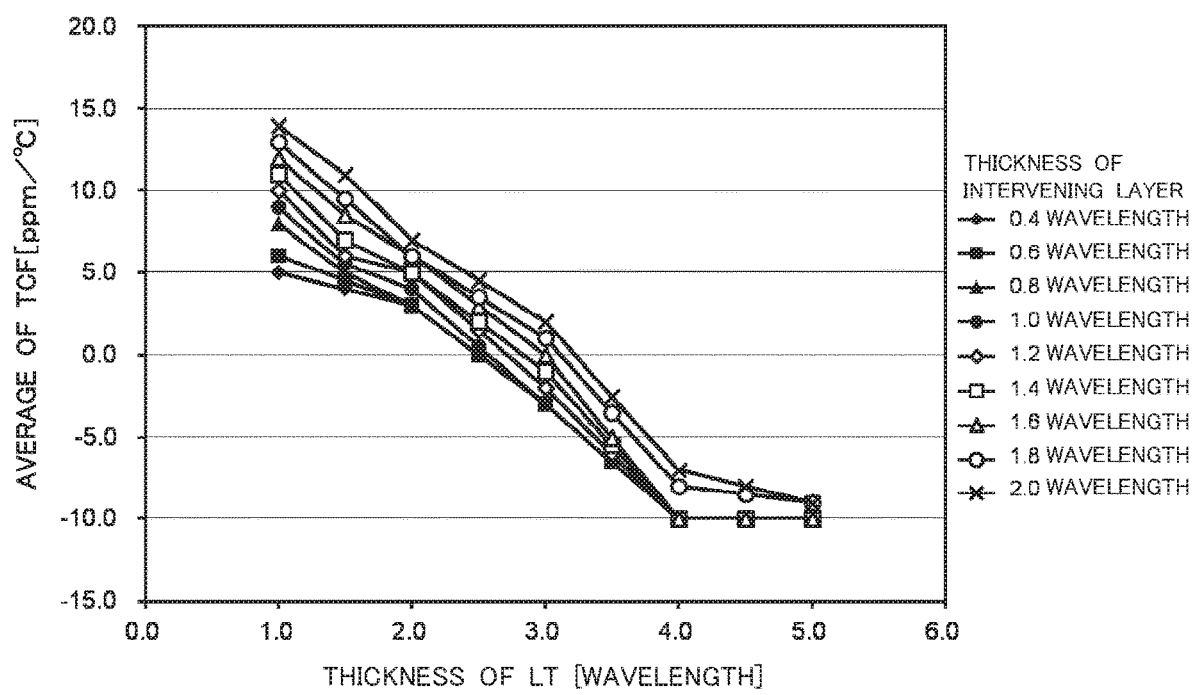
FIG. 8 is a graph showing a relationship between the thickness of each of the LT substrates in Example 5 and an average value of TCF.

FIG. 8 shows the evaluation results of temperature coefficients (TCF) of resonant and antiresonant frequencies in a temperature range of from 20° C. to 85° C. regarding each of the produced resonators. The horizontal axis is the thickness of each of the LT substrates and the vertical axis is the average value of TCF.

According to the results, the average value of TCF is kept as low as 15.0 ppm/° C. or less regardless of the thickness of the LT substrate and the thickness of the intervening layer. Further, when the thickness of the LT substrate is equal to or less than 3.0 wavelength, the smaller the thickness of the intervening layer is, the more the average value of TCF tends to decrease.

Figure 9:
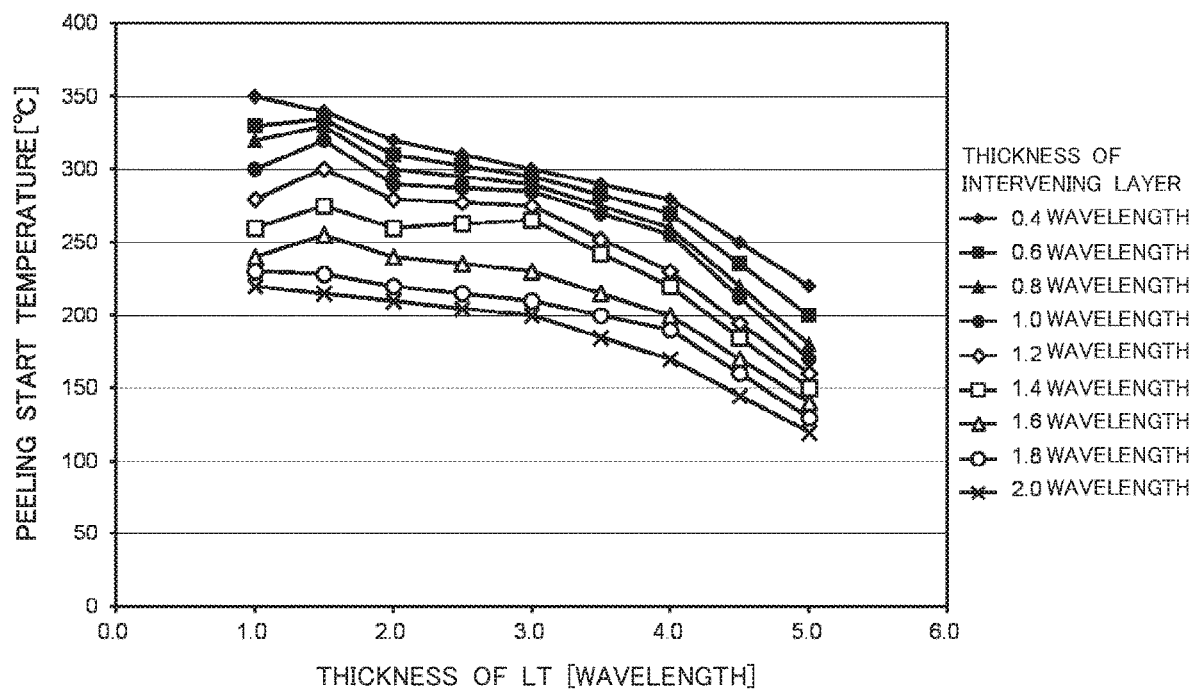
FIG. 9 is a graph showing a relationship between the thickness of each of the LT substrates in Example 5 and the peeling start temperature.

FIG. 9 shows the results obtained by investigating the temperature at which the LT substrate starts to peel after heating each of the composite substrates in which the thickness of the LT substrate is from 5 μm (1.0 wavelength) to 25 μm (5.0 wavelength) and the thickness of the intervening layer ($SiO_2$ and thermally oxidized silica) is from 2 μm (0.4 wavelength) to 10 μm (2.0 wavelength) in an oven. The horizontal axis is the thickness of each of the LT substrates and the vertical axis is the peeling start temperature of the LT substrate.

According to the results, it can be seen that the smaller the thickness of the LT substrate is, the smaller the thickness of the intervening layer is, the higher the peeling start temperature is, the more excellent the heat resistance is.

Example 6

In Example 6, first, an LT single crystal ingot having a roughly congruent composition (Li:Ta=48.5:51.5) and a diameter of 4 inch was subjected to a single polarization treatment and the resulting ingot was sliced to form 370-μm-thick 42° rotated Y-cut LT substrates. Thereafter, each of the sliced wafers was subjected to a lapping step, if necessary, in order to adjust the surface roughness of each of the sliced wafers to 0.15 μm (as an arithmetic average roughness Ra value). The finished thickness of each of the sliced wafers was 350 μm.

Then, the surface of each of the sliced wafers was polished and finished to form a quasi-mirror surface having an Ra value of 0.01 μm. After that, a powder containing $Li_3TaO_4$ as a main component was laid in a small container, and each of the substrates was buried in the powder. At this time, the powder in which $Li_3TaO_4$ was a main component was prepared by mixing $Li_2CO_3$ powder and $Ta_2O_5$ powder at a molar ratio of 7:3 and firing the mixed powder at 1300° C. for 12 hours, and the resulting powder was used.

This small container was set in an electric furnace, which was filled with an $N_2$ atmosphere and heated at 975° C. for 100 hours. Thereafter, in the temperature lowering process, the substrate was subjected to an annealing treatment at 800° C. for 12 hours. Further, in the subsequent temperature lowering process (cooling from 770° C. to 500° C.), an electric field of 4000 V/m was applied in roughly +Z axis direction of the LT substrate.

After this treatment, the surface in the −Z axis direction side of the LT substrate was sandblasted to produce a plurality of LT substrates having uneven structures with the same degree of arithmetic average roughness Ra (Ra=300 nm±10) and different average lengths RSm.

With respect of one of the thus produced LT substrates, a laser Raman spectrometer (LabRam HR series, manufactured by HORIBA Scientific Inc., Ar ion laser, spot size 1 μm, room temperature) was used to measure the half width of the Raman shift peak around 600 $cm^{-1}$ in a depth-wise direction from the surface of the LT substrate. Thus, the Raman profile shown in FIG. 10 was obtained.

Figure 10:
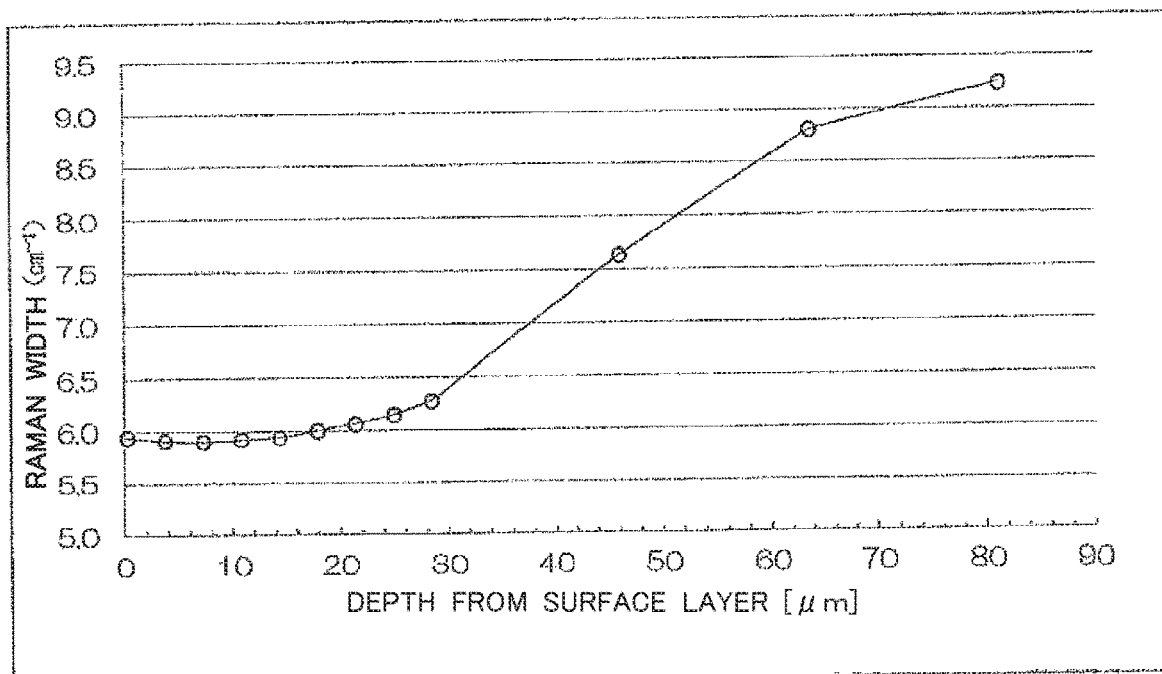
FIG. 10 is a graph showing a Raman profile of each of the LT substrates used in Example 5.

From the results shown in FIG. 10, the Raman half width of the surface of the LT substrate was different from the Raman half width of the inside of the LT substrate. The Raman half width was from 5.9 to 6.0 $cm^{-1}$ in 0 μm to about 20 μm depths from the substrate, and the value was approximately constant. This shows that the Li concentration at a depth of 20 μm from the surface of the LT substrate is roughly uniform.

Further, the Raman half width at a depth of 20 μm from the surface of the LT substrate is from about 5.9 to 6.0 $cm^{-1}$. Accordingly, when the above Formula (2) is used, the composition in that range is approximately Li/(Li+Ta) =0.5015 to 0.502. When the composition is expressed as Li:Ta=50−α:50+α, α=−0.20 to −0.15. This confirms that the composition is a pseudo stoichiometric composition.

Next, an about 10 μm-thick $SiO_2$ layer was deposited on the uneven structure-formed surface of each of the LT substrates using the plasma CVD method at 35° C., and then the $SiO_2$ deposited surface was polished to form a mirror surface.

Figure 11:
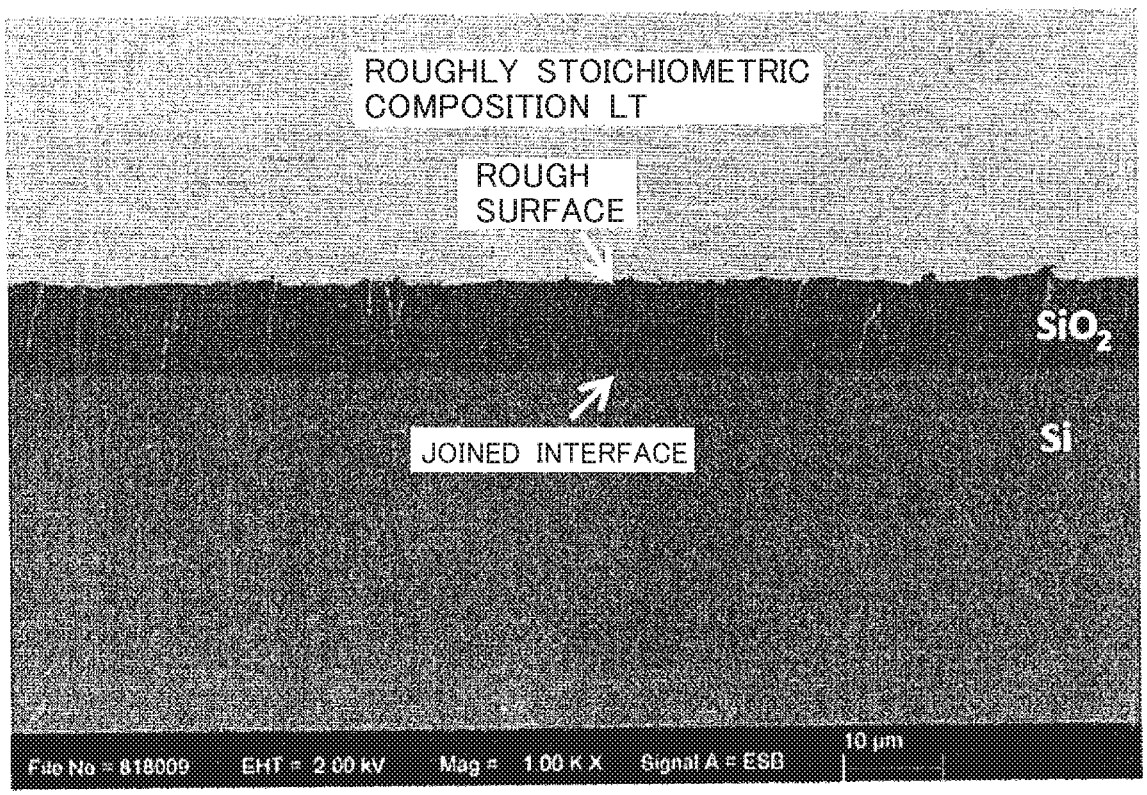
FIG. 11 is a cross-sectional SEM image in the vicinity of the joined interface of the composite substrate of Example 5.

Then, both the $SiO_2$ mirror surface and the mirror surface of the Si substrate (550 μm in thickness) serving as the support substrate were subjected to plasma surface activation and bonded to each other. Further, each of the LT substrates was polished to be thinned to a thickness of 20 μm, and thus composite substrates were produced. Therefore, the Li concentration of the LT substrate is roughly uniform in the thickness direction and is a pseudo stoichiometric composition. FIG. 11 shows a cross-sectional SEM image of the produced composite substrate.

In addition, a 0.4 μm-thick Al film was formed on the surface at the side of the LT substrate of each of the produced composite substrates by sputtering, and further electrodes were formed by photolithography, thereby producing a four-stage ladder filter with a wavelength of about 5 μm made of two parallel resonators and four series resonators. At this time, a g-line stepper was used for photolithography exposure and a mixed gas of $Cl_2$, $BCl_3$, $N_2$, and $CF_4$ was used for Al etching.

Figure 12:
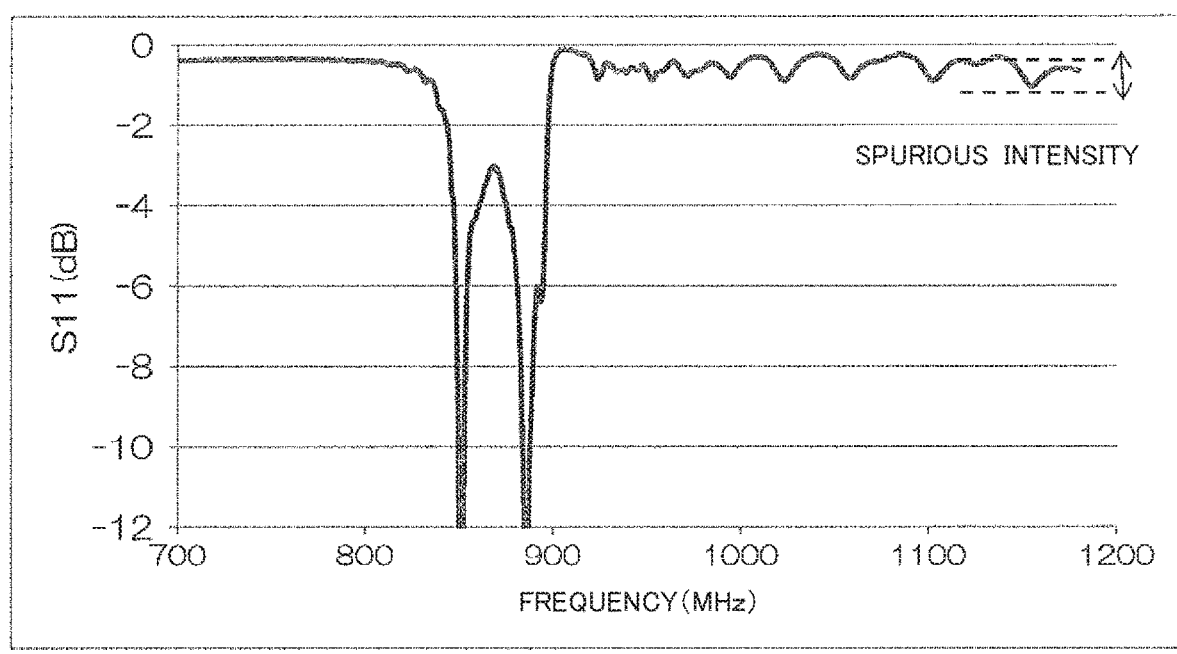
FIG. 12 is a graph showing S11 (reflection characteristics) of a four-stage ladder filter produced using the composite substrate of Example 5.
Figure 13:
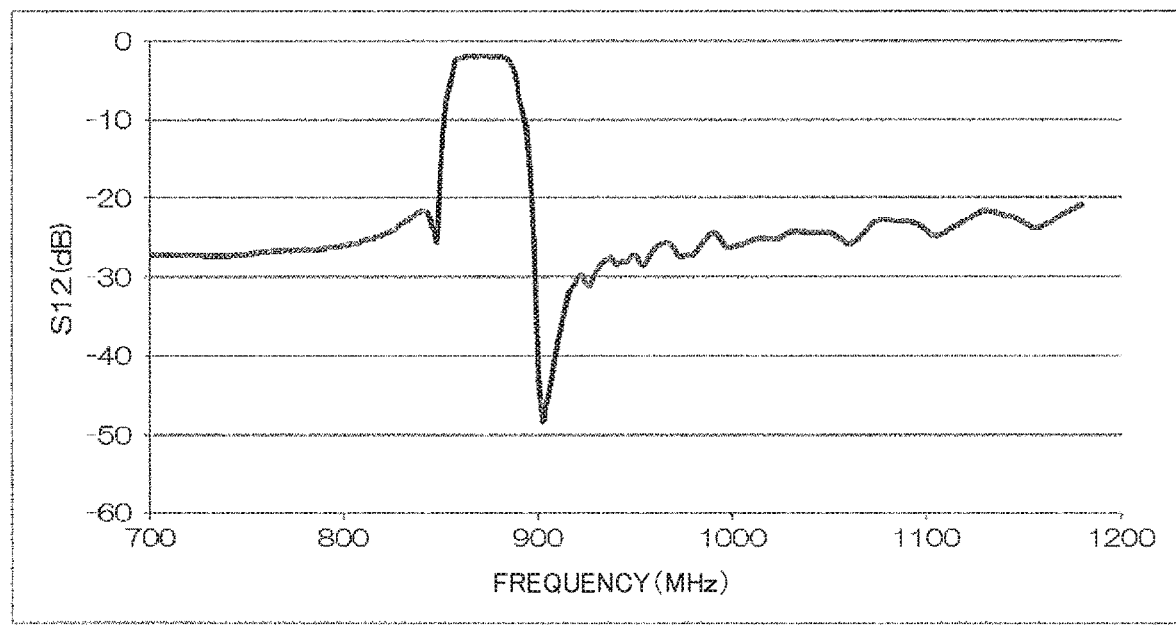
FIG. 13 is a graph showing S12 (insertion loss) of the four-stage ladder filter produced using the composite substrate of Example 5.

Finally, S11 (reflection characteristics) and S12 (insertion loss) of the produced four-stage ladder filter were measured using a network analyzer. Then, the difference between the peaks and valleys of the observed spurious was evaluated as the spurious intensity. FIGS. 12 and 13 show the waveforms of S11 and S12 of the composite substrate in which λ is equal to 5 μm and the value of RSm/λ is 0.2.

Figure 14:
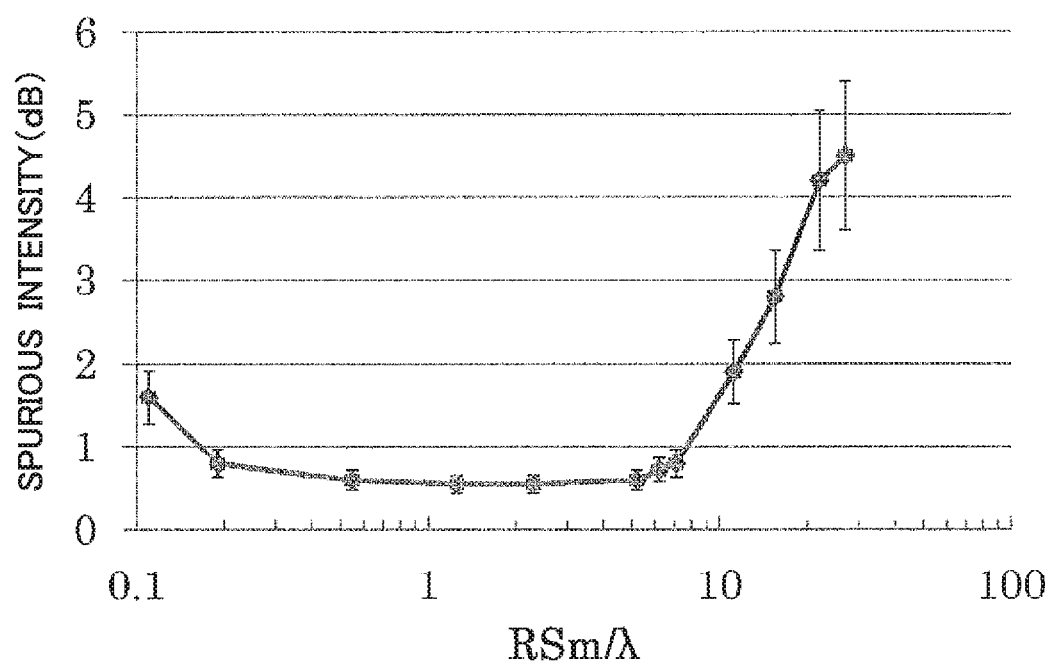
FIG. 14 is a graph showing a relationship between spurious intensity and RSm/λ in Example 5.

FIG. 14 shows the evaluation results of the four-stage ladder filter made of each of the composite substrates. The horizontal axis is RSm/λ, and λ is equal to 5 μm. Also, its vertical axis is the spurious intensity.

According to the results, it can be seen that the spurious intensity can be effectively reduced when the value of RSm/λ is equal to or more than 0.2 and equal to or less than 7.0.

Further, a four-stage ladder filter with a wavelength of about 2 μm was produced using the same composite substrates and was evaluated. The filter showed the same tendency as in the case of a wavelength of about 5 μm.

Figure 15:
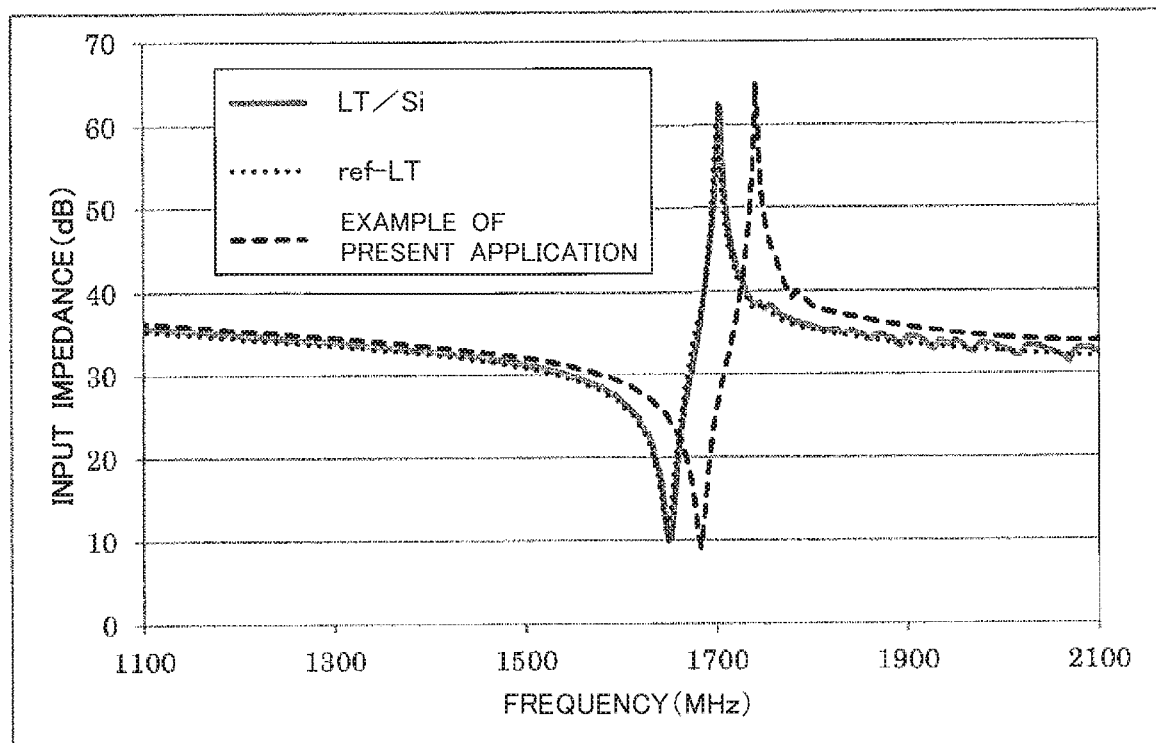
FIG. 15 is a graph showing an input impedance waveform of a resonator produced using the composite substrate of Example 5.

Further, a resonator having a wavelength of about 2.4 μm was produced using a composite substrate having an RSm/λ value of 1.25 and the resulting resonator was evaluated. FIG. 15 shows the input impedance waveform of the produced resonator. Here, for comparison, the figure shows the input impedance waveform of a resonator produced using an LT substrate (ref-LT) having a roughly congruent composition and the input impedance waveform of a resonator produced using a composite substrate (LT/Si) obtained by directly bonding an LT substrate and a Si substrate each having a roughly congruent composition to each other. The crystal orientations of the LT substrates are all the same.

A resonant load Qso, an antiresonant load Qpo, and an electromechanical coupling coefficient $K^2$ were calculated from the resonant and antiresonant frequencies of the input impedance waveforms using the following Equations (4) and (5). The calculated values are shown in Table 1.

[Expression 4]

$$Z(\omega) = \frac{X_p}{j \cdot \left(\frac{\omega}{\omega_p}\right)} \cdot \frac{\left[1 - \left(\frac{\omega}{\omega_s}\right)^2 + j \cdot \left(\frac{\omega}{\omega_s}\right) \cdot \frac{1}{Q_{so}}\right]}{\left[1 - \left(\frac{\omega}{\omega_p}\right)^2 + j \cdot \left(\frac{\omega}{\omega_p}\right) \cdot \frac{1}{Q_{po}}\right]} \quad (4)$$

$$r = \frac{C_0}{C_1} \quad \omega_s = \frac{1}{\sqrt{L_1 \cdot C_1}} \quad \left(\frac{\omega_p}{\omega_s}\right)^2 = 1 + \frac{1}{r}$$

$$X_p = \frac{1}{\omega_p \cdot C_0} \quad \frac{1}{Q_s} = \omega_s \cdot R_1 \cdot C_1 \quad \frac{1}{Q_s} = \frac{\omega_s \cdot R_0 \cdot C_0}{r}$$

$$\frac{1}{Q_{x0}} = \frac{1}{Q_s} \cdot \left(1 + \frac{R_s}{R_1}\right) \quad \frac{1}{Q_{pn}} = \left(\frac{\omega_p}{\omega_s}\right) \cdot \left(\frac{1}{Q_s} + \frac{1}{Q_o}\right)$$

where $$K^2 = (\pi fr/2fa)/\tan(\pi fr/2fa) \quad (5)$$

fr: resonant frequency
fa: antiresonant frequency

TABLE 1

|  | Qso | Qpo | $K^2$ [%] |
| --- | --- | --- | --- |
| Example 5 Stoichiometric composition LT/Si composite substrate | 600 | 570 | 8.4 |
| Congruent composition LT/Si composite substrate | 500 | 550 | 7.4 |
| Congruent composition LT substrate | 600 | 420 | 7.4 |

Further, the temperature coefficient of frequency (TCF) in a temperature range of from 15° C. to 85° C. was measured for each of the produced resonators. The results are shown in Table 2.

TABLE 2

|  | Resonant TCF [ppm/° C.] | Antiresonant TCF [ppm/° C.] | Average TCF [ppm/° C.] |
| --- | --- | --- | --- |
| Example 5 Stoichiometric composition LT/Si composite substrate | 7 | −11 | −2 |
| Congruent composition LT/Si composite substrate | −1 | −17 | −9 |
| Congruent composition LT substrate | −35 | −41 | −38 |

From the results, it is found that when the Li concentration of the LT substrate constituting the composite substrate is roughly uniform and the Li concentration is a pseudo stoichiometric composition so that a composite substrate exhibiting a high mechanical coupling coefficient and excellent temperature characteristics can be obtained.

Example 7

In Example 7, among the LT substrates which were subjected to a vapor phase treatment for diffusing Li and were used in Example 6, a plurality of LT substrates having uneven structures (Ra=300 nm±10% and RSm=3 μm±10%) was provided.

Next, an about 10 μm-thick $SiO_2$ layer was deposited on the uneven structure-formed surface of each of the LT substrates using the plasma CVD method at 35° C., and then the $SiO_2$ deposited surface was polished to form a mirror surface.

At this time, the amount of polishing was changed depending on the LT substrate so that the thickness of $SiO_2$ was from 1.5 μm to 9.5 μm.

The Si substrate serving as the support substrate was subjected to a heat treatment at 850° C. in an oxygen atmosphere and thus a 500 nm-thick thermally oxidized silica layer was formed on the surface of the Si substrate.

Then, both the $SiO_2$ mirror surface and the thermally oxidized silica layer formed on the surface of the Si substrate were subjected to plasma surface activation and bonded to each other. Further, each of the LT substrates was polished and composite substrates were produced.

At this time, the amount of polishing was changed depending on the substrate so that the thickness of the LT substrate was from 5 μm to 25 μm.

A four-stage ladder filter and a resonator (wavelength of the surface acoustic wave: 5 μm) were formed using the produced composite substrates and were evaluated in the same manner as in Example 5. The filter and the resonator showed the same tendency as in the case of Example 5.

REFERENCE SIGNS LIST

1 Piezoelectric single crystal substrate
2 Support substrate
3 Intervening layer
4 Portion of the joined interface between the piezoelectric single crystal substrate and the support substrate
5 Adhesive
6 Inorganic material

The invention claimed is:
1. A composite substrate for a surface acoustic wave device comprising:
 a piezoelectric single crystal substrate; and
 a support substrate, wherein, at a portion of a joined interface between the piezoelectric single crystal substrate and the support substrate, at least one of the piezoelectric single crystal substrate and the support substrate has an uneven structure, and a ratio of an average length RSm of elements in a cross-sectional curve of the uneven structure to a wavelength λ of a surface acoustic wave when the composite substrate is used as the surface acoustic wave device is equal to or more than 0.2 and equal to or less than 7.0.

2. The composite substrate for the surface acoustic wave device according to claim 1, wherein an arithmetic average roughness Ra in the cross-sectional curve of the uneven structure is equal to or more than 100 nm.

3. The composite substrate for the surface acoustic wave device according to claim 1, wherein, at the portion of the joined interface between the piezoelectric single crystal substrate and the support substrate, an intervening layer is present between the piezoelectric single crystal substrate and the support substrate.

4. The composite substrate for the surface acoustic wave device according to claim 3, wherein the composite substrate contains at least one of $SiO_2$, $SiO_{2\pm0.5}$, a-Si, p-Si, a-SiC, and $Al_2O_3$ as the intervening layer.

5. The composite substrate for the surface acoustic wave device according to claim 3, wherein the composite substrate contains at least a thermally oxidized silica or a silica heat-treated at a temperature of 800° C. or higher as the intervening layer.

6. The composite substrate for the surface acoustic wave device according to claim 3, wherein a thickness of the intervening layer is equal to or less than 1.2 times the wavelength λ of the surface acoustic wave when the composite substrate is used as the surface acoustic wave device.

7. The composite substrate for the surface acoustic wave device according to claim 1, wherein a thickness of the piezoelectric single crystal substrate is equal to or more than 1.0 times and equal to or less than 3.5 times the wavelength λ of the surface acoustic wave when the composite substrate is used as the surface acoustic wave device.

8. The composite substrate for the surface acoustic wave device according to claim 1, wherein the support substrate is any one of silicon, glass, quartz, alumina, sapphire, silicon carbide, and silicon nitride.

9. The composite substrate for the surface acoustic wave device according to claim 1, wherein the uneven structure is a pyramid-shaped structure.

10. The composite substrate for the surface acoustic wave device according to claim 1, wherein the piezoelectric single crystal substrate is a lithium tantalate single crystal substrate or a lithium niobate single crystal substrate.

11. The composite substrate for the surface acoustic wave device according to claim 10, wherein the piezoelectric single crystal substrate is a rotated Y-cut lithium tantalate single crystal substrate whose crystal orientation is rotated from 36° Y through 49° Y cut.

12. The composite substrate for the surface acoustic wave device according to claim 10, wherein the piezoelectric single crystal substrate is a lithium tantalate single crystal substrate doped with Fe at a concentration of from 25 ppm to 150 ppm.

13. The composite substrate for the surface acoustic wave device according to claim 10, wherein the piezoelectric single crystal substrate has a roughly uniform Li concentration in a thickness direction of the piezoelectric single crystal substrate.

14. The composite substrate for the surface acoustic wave device according to claim 13, wherein, in the piezoelectric single crystal substrate, a ratio of Li to Ta or Nb is Li:Ta=50−α:50+α or Li:Nb=50−α:50+α, and a is in a range of −1.0<α<2.5.

15. The composite substrate for the surface acoustic wave device according to claim 10, wherein the piezoelectric single crystal substrate has a Li concentration which varies in a thickness direction of the piezoelectric single crystal substrate.

16. The composite substrate for the surface acoustic wave device according to claim 15, wherein the Li concentration at a side of the portion of the joined interface between the piezoelectric single crystal substrate and the support substrate is larger than the Li concentration at a surface at an opposite side of the interface side.

17. The composite substrate for the surface acoustic wave device according to claim 15, wherein a ratio of Li to Ta or Nb at the side of the portion of the joined interface between the piezoelectric single crystal substrate and the support substrate is Li:Ta=50−α:50+α or Li:Nb=50−α:50+α, and a is in a range of −1.0<α<2.5.

18. A surface acoustic wave device comprising the composite substrate according to claim 1.

19. A method of producing a composite substrate for a surface acoustic wave device comprising at least the steps of:

forming an uneven structure on a surface of a piezoelectric single crystal substrate and/or a support substrate; and forming an intervening layer on the uneven structure, wherein the method includes any one of the steps of:

joining the intervening layer formed on the piezoelectric single crystal substrate with the support substrate;

joining the intervening layer formed on the support substrate with the piezoelectric single crystal substrate; and joining the intervening layer formed on the piezoelectric single crystal substrate with the intervening layer formed on the support substrate, wherein the piezoelectric single crystal substrate has a Li concentration which varies in a thickness direction of the piezoelectric single crystal substrate, the Li concentration at an arbitrary depth from at least one surface of the piezoelectric single crystal substrate is roughly uniform, the piezoelectric single crystal substrate is joined with the support substrate thus forming a joined surface, and a surface layer of the piezoelectric single crystal substrate at an opposite side of the joined surface is removed so as to leave at least a part of a portion in which the Li concentration is roughly uniform or to leave only the portion in which the Li concentration is roughly uniform.

20. The method of producing the composite substrate for the surface acoustic wave device according to claim 19, comprising a step of mirror-polishing a surface of the intervening layer.

21. The method of producing the composite substrate for the surface acoustic wave device according to claim 19, wherein the portion in which the Li concentration is roughly uniform is a pseudo stoichiometric composition.

22. A method of producing a composite substrate for surface acoustic wave device comprising at least the steps of:

forming an uneven structure on a surface of a support substrate by wet etching; and joining the support substrate with a piezoelectric single crystal substrate so that the uneven structure-formed surface of the support substrate is a joined interface, wherein the piezoelectric single crystal substrate has a Li concentration which varies in a thickness direction of the piezoelectric single crystal substrate, the Li concentration at an arbitrary depth from at least one surface of the piezoelectric single crystal substrate is roughly uniform, the piezoelectric single crystal substrate is joined with the support substrate thus forming a joined surface, and a surface layer of the piezoelectric single crystal substrate at an opposite side of the joined surface is removed so as to leave at least a part of a portion in which the Li concentration is roughly uniform or to leave only the portion in which the Li concentration is roughly uniform.

23. The method of producing the composite substrate for the surface acoustic wave device according to claim 22, wherein the step of forming the uneven structure is a step of forming a pyramid-shaped uneven structure on the surface of a support substrate made of silicon single crystal by wet etching.

* * * * *